(12) United States Patent
Lee

(10) Patent No.: US 7,177,154 B2
(45) Date of Patent: Feb. 13, 2007

(54) COMPUTER

(75) Inventor: Sang Cheol Lee, Kyungki-do (KR)

(73) Assignee: Zalman Tech Co. Ltd. (KR)

( * ) Notice: Subject to any disclaimer, the term of this patent is extended or adjusted under 35 U.S.C. 154(b) by 249 days.

(21) Appl. No.: 10/844,717

(22) Filed: May 13, 2004

(65) Prior Publication Data
US 2004/0228093 A1    Nov. 18, 2004

(30) Foreign Application Priority Data
May 13, 2003 (KR) ............... 10-2003-0030358
Apr. 21, 2004 (KR) ............... 10-2004-0027563

(51) Int. Cl.
*H05K 7/20* (2006.01)

(52) U.S. Cl. ............... 361/704; 361/700; 165/80.4; 165/104.33

(58) Field of Classification Search ............ 361/704, 361/698–700; 165/80.4, 104.33, 185; 174/15.2
See application file for complete search history.

(56) References Cited

U.S. PATENT DOCUMENTS

| | | | |
|---|---|---|---|
| 4,557,225 A * | 12/1985 | Sagues et al. ............ 123/41.31 |
| 4,807,441 A * | 2/1989 | Agee et al. .................. 62/3.3 |
| 5,243,493 A * | 9/1993 | Jeng et al. .................. 361/690 |
| 5,331,510 A * | 7/1994 | Ouchi et al. ................ 361/702 |
| 5,764,483 A * | 6/1998 | Ohashi et al. .............. 361/699 |
| 6,078,155 A * | 6/2000 | Tominaga et al. .......... 318/293 |
| 6,101,090 A * | 8/2000 | Gates ........................ 361/690 |
| 6,115,251 A * | 9/2000 | Patel et al. ................. 361/699 |
| 6,234,240 B1 * | 5/2001 | Cheon ....................... 165/80.3 |
| 6,320,746 B2 * | 11/2001 | Pei et al. .................... 361/695 |
| 6,578,939 B1 * | 6/2003 | Mayer ...................... 312/334.5 |
| 6,585,039 B2 * | 7/2003 | Sagal et al. ................. 165/185 |
| 6,747,869 B2 * | 6/2004 | Dong ........................ 361/687 |
| 6,979,772 B2 * | 12/2005 | Meng-Cheng et al. .. 174/17 VA |
| 2002/0139512 A1 * | 10/2002 | Low et al. ................... 165/41 |
| 2003/0019607 A1 * | 1/2003 | Wei ........................... 165/46 |
| 2005/0083660 A1 * | 4/2005 | Lee ........................... 361/709 |

* cited by examiner

*Primary Examiner*—Michael Datskovsky
*Assistant Examiner*—Robert J. Hoffberg
(74) *Attorney, Agent, or Firm*—Tuchman & Park LLC

(57) ABSTRACT

Provided is a computer with a case and a plurality of parts, including heat generating components that generate heat when operated, installed in the case, wherein the case includes a plurality of plates, and heat generated by at least one of the heat generating components when operated is transmitted to at least one of the plates via a heat conduction unit, which connects the at least one of the heat generating parts and the plate, and externally dissipated from the case. The heat generating components mounted in the case can be noiselessly and efficiently cooled without a noise-generating cooling fan.

16 Claims, 23 Drawing Sheets

COMPUTER

BACKGROUND OF THE INVENTION

This application claims the priority of Korean Patent Application No. 2003-30358, filed on May 13, 2003, and No. 2004-27563, filed on Apr. 21, 2004, in the Korean Intellectual Property Office, the disclosures of which are incorporated herein in their entirety by reference.

1. Field of the Invention

The present invention relates to a computer, and more particularly, to a computer in which heat generating components can be noiselessly and efficiently cooled not using cooling fans.

2. Description of the Related Art

In general, computers are comprised of a variety of functional parts. Representative examples of functional parts that may be installed in a computer case include a main board, a central processing unit (CPU), a graphics card, a sound card, a power supply, a hard drive, a floppy disk drive, a CD-ROM drive, a DVD-ROM drive, etc. These internal parts installed in the computer case are connected to external peripheral devices, for example, a monitor, a mouse, a keyboard, an external memory device, a printer, etc. Among such internal parts mounted in the computer case, the CPU, the graphics card, and the power supply are known as typical heat generating elements. When the temperatures of the internal parts are elevated by heat generated by these heat generating elements, the performances of the internal parts deteriorate and they may not function at all in the worst case. As more advanced computer systems appear, a larger amount of heat is generated by the heat generating components, raising a need to cool the heat generating components. This is one of the critical issues that the computer industry is facing.

A general method of cooling heat generating components installed in a computer case involves bringing a heat absorbing heat sink into contact with each of the heat generating components and blowing cooling air over the heat sinks using cooling fans. Various research projects, for example, research regarding changing a material or shape of such a heat sink, have been conducted to efficiently absorb or dissipate heat generated by the heat generating components. In conventional computer cooling systems developed up to date, commonly, each heat generating component installed in a computer case is cooled by a cooling fan attached to the same, and the air that is heated in the computer case is externally discharged by another cooling fan attached to the body of the computer base. However, such conventional computer cooling systems have the following problems.

Since a plurality of cooling fans, which turn at a high speed, are installed to cool the heat generating sources in the computer case, a large amount of noise is generated during operation of the computer system. Such noise generated by the cooling fans generally bothers computer users and lowers working efficiency. Another problem is that external dust particles stick to the parts in the computer case as the air is continuously exchanged with a large amount of external air by the cooling fan during the operation of the computer system. This problem becomes worst due to the electrostatic force generated by the internal parts and finally may lead to operational failures of the parts.

Another problem with the conventional computer cooling system lies in the inefficiency due to the active cooling of the heat generating components within the computer case. The internal temperature of a computer delimited by the computer case rises in a short time to be higher than the external temperature when the computer is operated. Thus, the heat generating components cannot be effectively cooled using the warm air in the computer case.

SUMMARY OF THE INVENTION

The present invention provides a computer with an efficient cooling system that can effectively cool heat generating components installed in a computer case without generating noise.

In one aspect of the present invention, there is provided a computer comprising a case and a plurality of parts, including heat generating components that generate heat when operated, installed in the case, wherein the case includes a plurality of plates; heat generated by at least one of the heat generating components when operated is transmitted to at least one of the plates via a heat conduction unit, which connects the at least one of the heat generating pars and the plate, and externally dissipated from the case.

According to specific embodiment, at least one of the plates may have a plurality of heat dissipating fins protruding from an external surface.

At least one of the plates may be comprise a main body portion and a heat dissipating plate portion adjacent to and is separated from an outer surface of the main body portion. The heat conduction unit may comprise a heat pipe having an end thermally connected to one of the heat generating components and the other end thermally connected to the heat dissipating plate portion. The heat dissipating plate portion may be thermally connected to the main body portion via a heat pipe. The heat dissipating plate portion may have a plurality of heat dissipating fins protruding from a surface.

A heat pipe may be installed between the heat dissipating fins.

The heat generating components may include a central processing unit, and a heat conduction unit that transfers heat generated by the central processing unit to the plate and comprises a heat pipe having an end thermally connected to the central processing unit and the other end thermally connected to the plate. The heat conduction unit may comprise a plurality of heat pipes having a diameter of 8 mm or less.

The heat generating components may include a graphics card, and a heat conduction unit that transfers heat generated by the graphics card to the plate may comprise a heat pipe having an end thermally connected to the graphics card and the other end thermally connected to the plate.

The heat conduction unit may comprises: a first heat conducting block contacting the end of the heat pipe and the heat generating component; and a second heat conducting block contacting the other end of the heat pipe and the plate.

The heat generating components may include a power supply, and a heat conduction unit that transfers heat generated by the power supply to the plate comprises a heat conducting member that is installed in the power supply, thermally connected to at least one of heat generating components of the power supply, and has a surface contacting an internal surface of the plate. The heat conducting member may be an aluminum circuit board having a surface contacting the internal surface of the plate and the other surface on which the heat generating electric components are mounted.

At least one of the plates may be hinged to the other plates such that the plate opens or closes the case. At least one of the plurality of parts comprises a connection port that is connected to an external peripheral device by a cable, the connection port being located inside the case, and at least one of the plates comprises a cable aperture. At least one of the plates comprises an electromagnetic wave interception block preventing electromagnetic waves generated by the parts from exiting the case.

At least one of the plates may be made of aluminum. At least one of the plates may comprise: a guide rail fixed to an internal surface; and a guide member which is slidably coupled to the guide rail along the length of the guide rail, and at least one of the parts is fixed to the guide member.

The computer may further comprise at least one leg member on a bottom of the case to space the bottom of the case from the floor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of the present invention will be described with reference to the appended drawings.

A computer according to a first embodiment of the present invention is illustrated in FIGS. 1 through 9.

Figure 1:
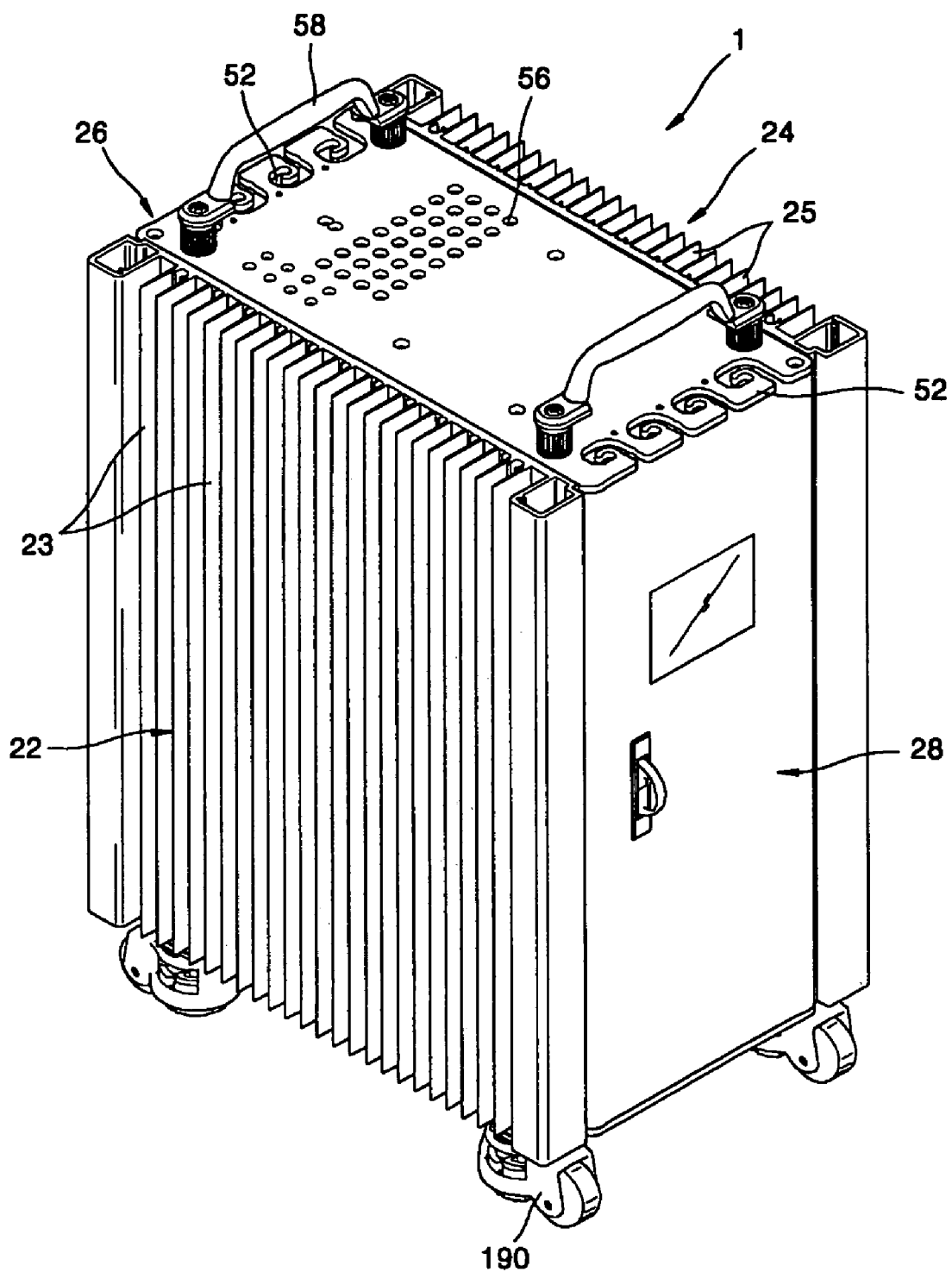
FIG. 1 is a perspective view of a computer according to a first embodiment of the present invention.
Figure 9:
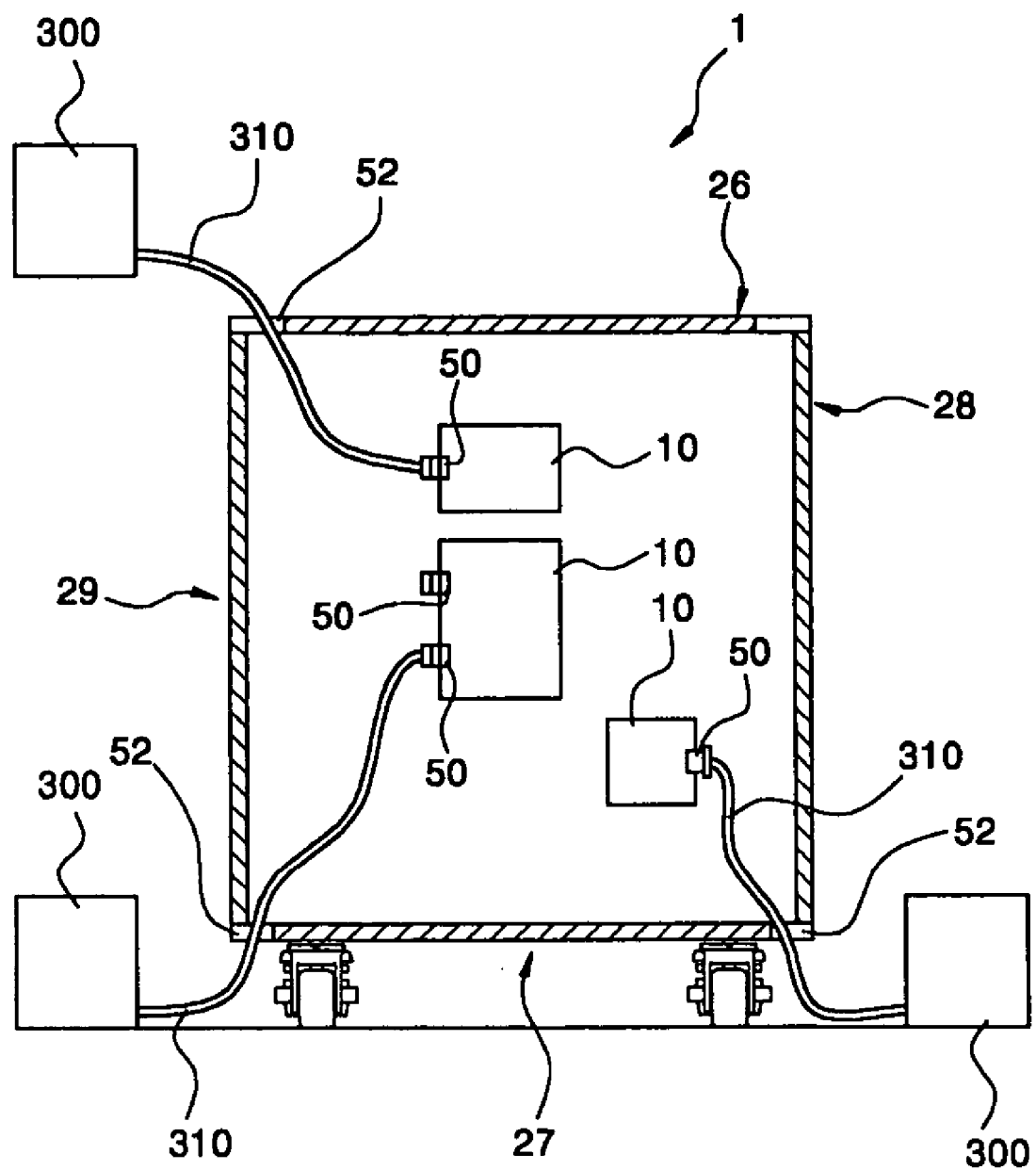
FIG. 9 is a view illustrating cable connections of connection ports of the parts in the computer case shown in FIG. 1 to external peripheral devices.

Referring to FIGS. 1 and 9, a computer 1 according to the present invention includes a plurality of parts 10 and a case accommodating the parts 10. Some of the parts generate heat when the computer 1 operates. The case includes a plurality of plates. In this embodiment, the case has a hexahedral shape and the plurality of plates includes a left plate 22, a right plate 24, an upper plate 26, a lower plate 27, a front plate 28, and a rear plate 29. Each of the plates has a thickness of about 5–7 mm. Examples of heat generating components installed in the case include a central processing unit (CPU) 120, a graphics card 140, and a power supply 160. Heat generated by the heat generating components is transmitted to the case via heat conduction units and externally dissipated.

The left plate 22, which forms the left wall of the case, is made of aluminum having a great thermal conductivity using extrusion. A plurality of vertical heat dissipating fins 23, which extend outward, are formed on the external side of the left plate 22.

Figure 3:
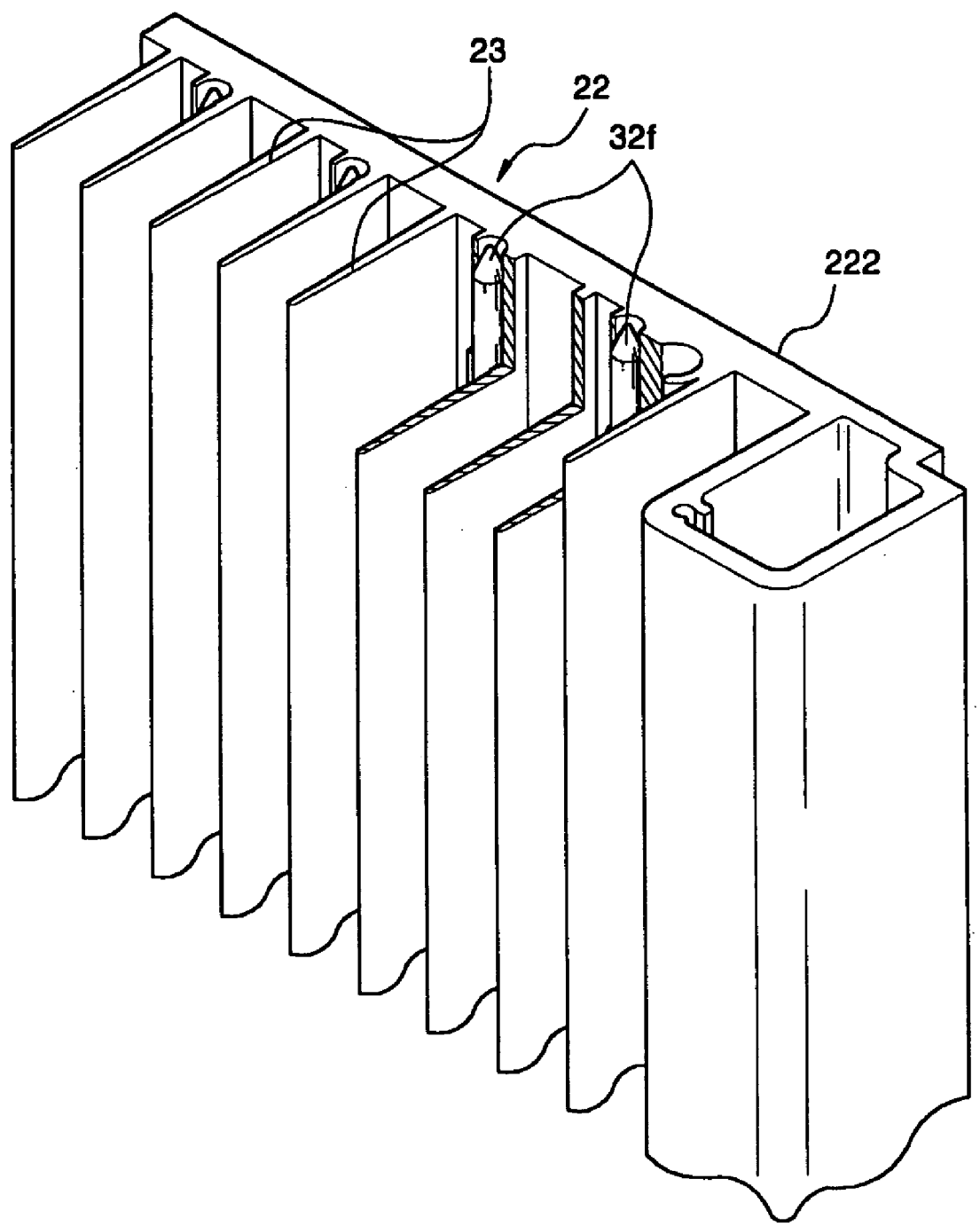
FIG. 3 is an enlarged view of a corner of a left plate shown in FIG. 2.

As shown in FIG. 3, a heat pipe 32f is disposed between the heat dissipating fins 23 on the left plate 22. The heat pipe 32f is mostly embedded in the left plate 22 and is partially exposed to the outside. A plurality of heat pipes 32f are disposed at an interval of one heat dissipating fin 23. The number of heat pipes 32f disposed between the heat dissipating fins 23 may be varied if required. The length of the heat pipes 32f may be equal to the height of the left plate 22.

The heat pipe 32f, which is also called "heat conduction pipe," absorbs the heat of a higher temperature portion of the left plate 22 and rapidly transmits the heat to a lower temperature portion thereof to evenly distribute the heat over the left plate 22. The heat pipe 32f also performs cooling by dissipating the heat into the air via the externally exposed portion thereof. The detailed structure of the heat pipe that transmits or dissipates heat has been disclosed elsewhere and is not a feature of the present invention. Thus, a description on the structure of the heat pipe will not be provided here. Unless indicated otherwise, the heat pipe described in the specification is arranged in a predetermined position such that a portion of the heat pipe that contacts a higher temperature area is level with or lower than a portion of the heat pipe that contacts a lower temperature area.

Figure 5A:
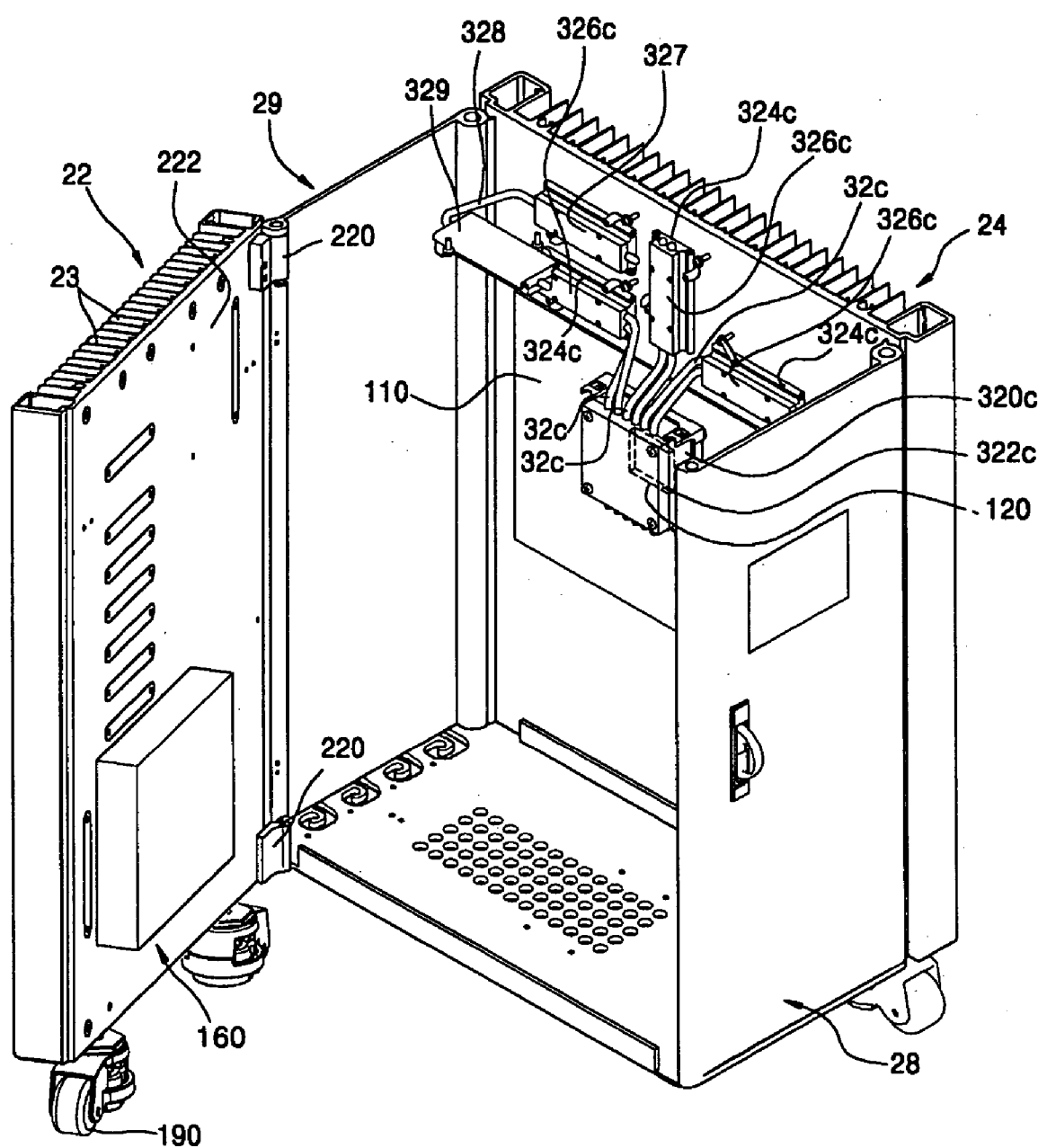
FIG. 5A shows a heat conduction unit for a central processing unit installed in the computer of FIG. 2.

Referring to FIG. 5A, the left plate 22 is hinged to the rear plate 29 by a pair of hinges 220 such that the left plate 22 opens or closes the case. Alternatively, the left plate 22 may be hinged to the front plate 28.

The right plate 24, which forms the right wall of the case, and the left plate 22, which forms the left wall of the case, are identical in material and shape, except that the right plate 24 is not hinged. In other words, a plurality of vertical heat dissipating fins 25 are formed on the external side of the right plate 24, and a plurality of heat pipes 32f are disposed between the heat dissipating fins 25.

A pair of wheels 190 are attached to both ends of a bottom surface of each of the left plate 22 and the right plate 24. The wheels 190, which are four in total, allow convenient moving of the case. The pair of wheels 190 mounted on the left plate 22 enables the left plate 22 to turn more smoothly when opening or closing the case. In addition, the wheels 190 act as legs that space a bottom surface of the case from the floor, so that heat transmitted to the left plate 22 and the right plate 24 can be more effectively dissipated by air convection through the space below the bottom surface of the case. The heights of the wheels 190 can be individually adjusted for level adjustment of the case. Also, the wheels 190 have a common braking element preventing the case from rolling.

The upper and lower plates 26 and 27 are made of aluminum having a great thermal conductivity. Each of the upper and lower plates 26 and 27 has cable apertures 52 on front and rear edges so that various cables 310 pass through the cable apertures 52 for electrical connection (refer to FIG. 9).

Each of the cable apertures 52 has an electromagnetic wave interception (EMI) block 54. The EMI block 54 reduces or blocks electromagnetic waves generated by electronic parts mounted in the case from exiting the case. The shape or structure of the EMI block 54 is well known in the art and thus detailed descriptions thereon will not be provided here.

Each of the upper plate 26 and the lower plate 27 has a plurality of ventilation holes 56. The ventilation holes 56 are small circular holes. The ventilation holes 56 allow warm air in the case to be exchanged with external air. The upper plate 26 has a pair of knobs 58 used when a user moves the case.

Each of the front plate 28 and the rear plate 29 is made of aluminum having a great thermal conductivity. The front plate 28 is joined to the upper and lower plates 26 and 27 by hinge pins, such that the front plate 28 opens or closes the case. The front plate 28 has a knob 284 used to open or close the case and a display screen 286 on which operating states of the parts installed in the computer case are displayed. Although the rear plate 29 is illustrated as being fixed to other plates in the present embodiment, the rear plate 29 may be hinged to another plate such that it opens or closes the case.

Figure 2:
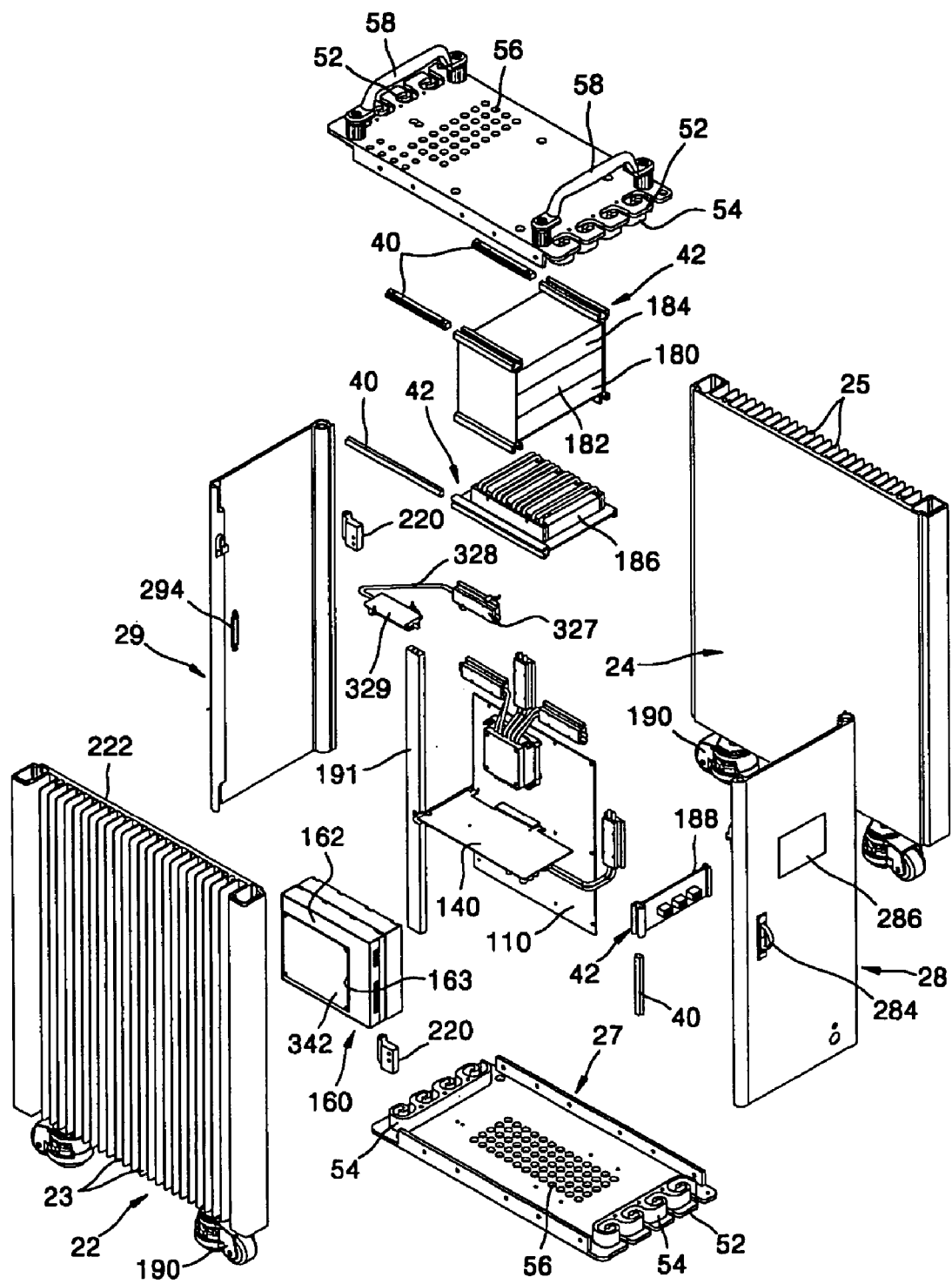
FIG. 2 is an exploded perspective view of the computer of FIG. 1.
Figure 4:
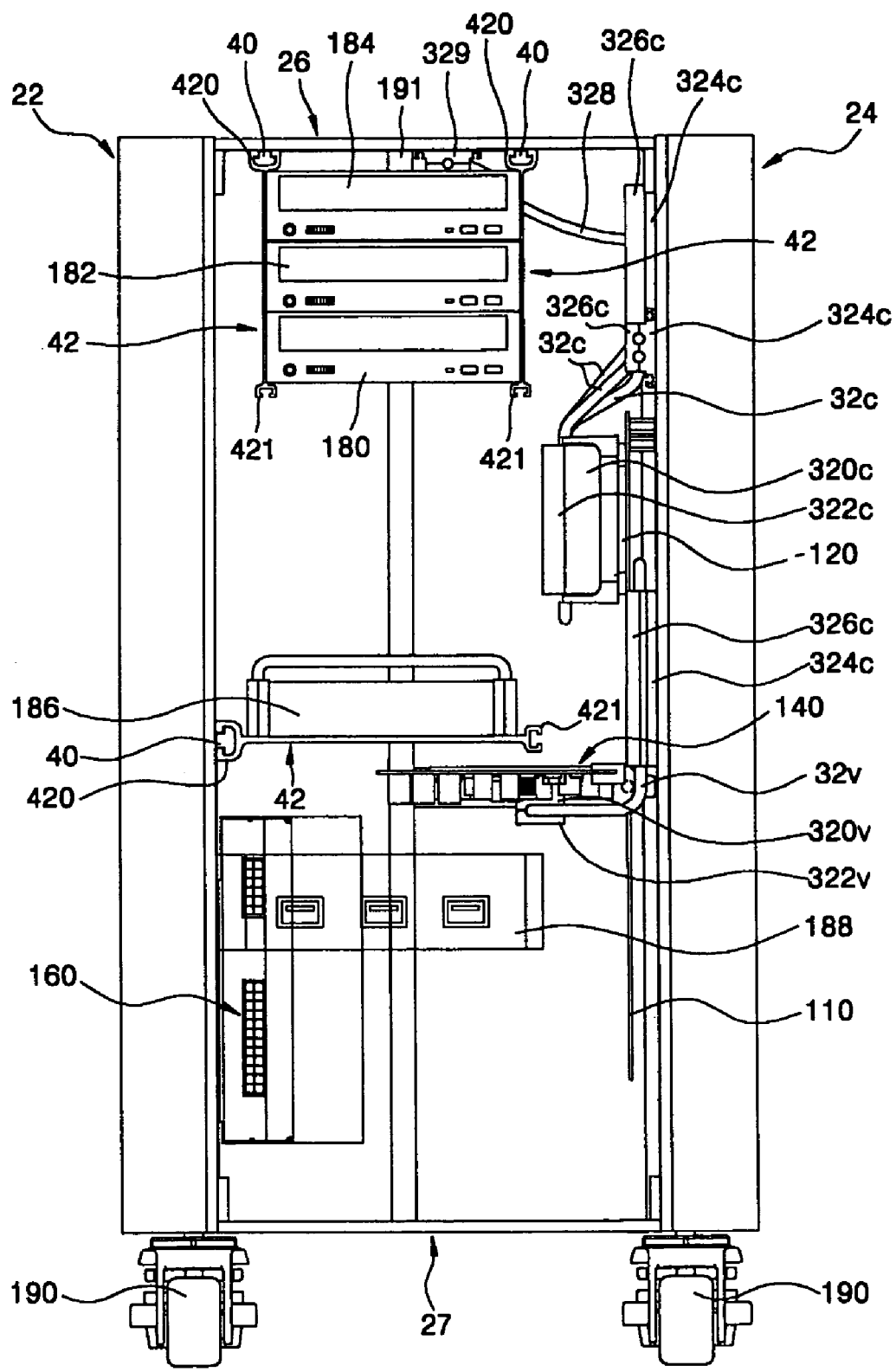
FIG. 4 is a front view of the computer of FIG. 1, in which a front plate of a case is not shown.

FIG. 5A illustrates a heat conduction unit for a central processing unit (CPU) 120, which is one of the heat generating components mounted in the computer case. Referring to FIGS. 2, 4, and 5A, the CPU 120 is mounted in an upper portion of a main board 110 that is fixed spaced from the right plate 24. A heat conduction unit is installed to transmit to the right plate 24 heat generated when the CPU 120 operates.

The heat conduction unit includes a plurality of heat pipes 32c. The plurality of heat pipes 32c may each have a diameter of 8 mm or less to be flexible enough to be easily bent into a desired shape using hands and can maintain the shape after being bent. In the embodiment illustrated in FIG. 5A, heat pipes having a diameter of about 6 mm are used. When the heat pipes 32c have sufficient flexibility to remain unhardened in a bending process, the heat pipes 32c can ensure impacts.

At least three heat pipes 32c may be installed. In the embodiment of FIG. 5A, six heat pipes 32c are installed. Because multiple heat pipes are used, the fundamental function of the heat pipes is maintained even when some of the heat pipes 32c malfunction, and only the malfunctioning heat pipes need to be replaced.

One end portion of each of the heat pipes 32c is thermally connected to the CPU 120 through a first heat conducting block, and the other end portion is thermally connected to an internal surface of the right plate 24 through a second heat conducting block. The first and second heat conducting blocks are made of a material having a great thermal conductivity, for example, aluminum or copper. The first heat conducting block is comprised of a first member 320c and a second member 322c, and the second heat conducting block is comprised of a first member 324c and a second member 326c.

The first member 320c of the first heat conducting block is attached to the CPU 120 such that heat generated by the CPU 120 is transmitted thereto, and the second member 322c is tightly coupled to the second member 320. Each of the first and second members 320c and 322c has six semi-cylindrical grooves on a surface that faces the other member. The plurality of semi-cylindrical grooves form six heat pipe receiving holes when the first and second members 320c and 322c are bound together. An end of each of the heat pipes 32c is tightly fitted into each of the heat pipe receiving holes.

Three second heat conducting blocks are arranged as illustrated in FIG. 5A to efficiently transmit the heat of the heat pipes 32c conducted from the CPU 120 to the right plate 24. Each of the second heat conducting blocks is comprised of a pair of first and second members 324c and 326c. The first member 324c is attached to the left plate 24, and the second member 326c is tightly coupled to the first member 324c. Each of the first and second members 324c and 326c has two semi-cylindrical grooves on a surface that faces the other member. The corresponding semi-cylindrical grooves of the first and second members 324c and 326c form heat pipe receiving holes when the first and second members 324c and 326c are bound together. The other end of each of the heat pipes 32c is tightly fitted into each of the heat pipe receiving holes.

A pair of heat conducting blocks 327 and 329 having a similar structure as the second heat conducting block, which is comprised of the first and second members, are attached to internal surfaces of the right plate 24 and the upper plate 26, respectively, as illustrated in FIG. 5A. The two heat conducting blocks 327 and 329 are connected by a heat pipe 328 so that heat can be transmitted from the right plate 24 to the upper plate 26. The heat transmitted to the upper plate 26 is externally dissipated.

Figure 5B:
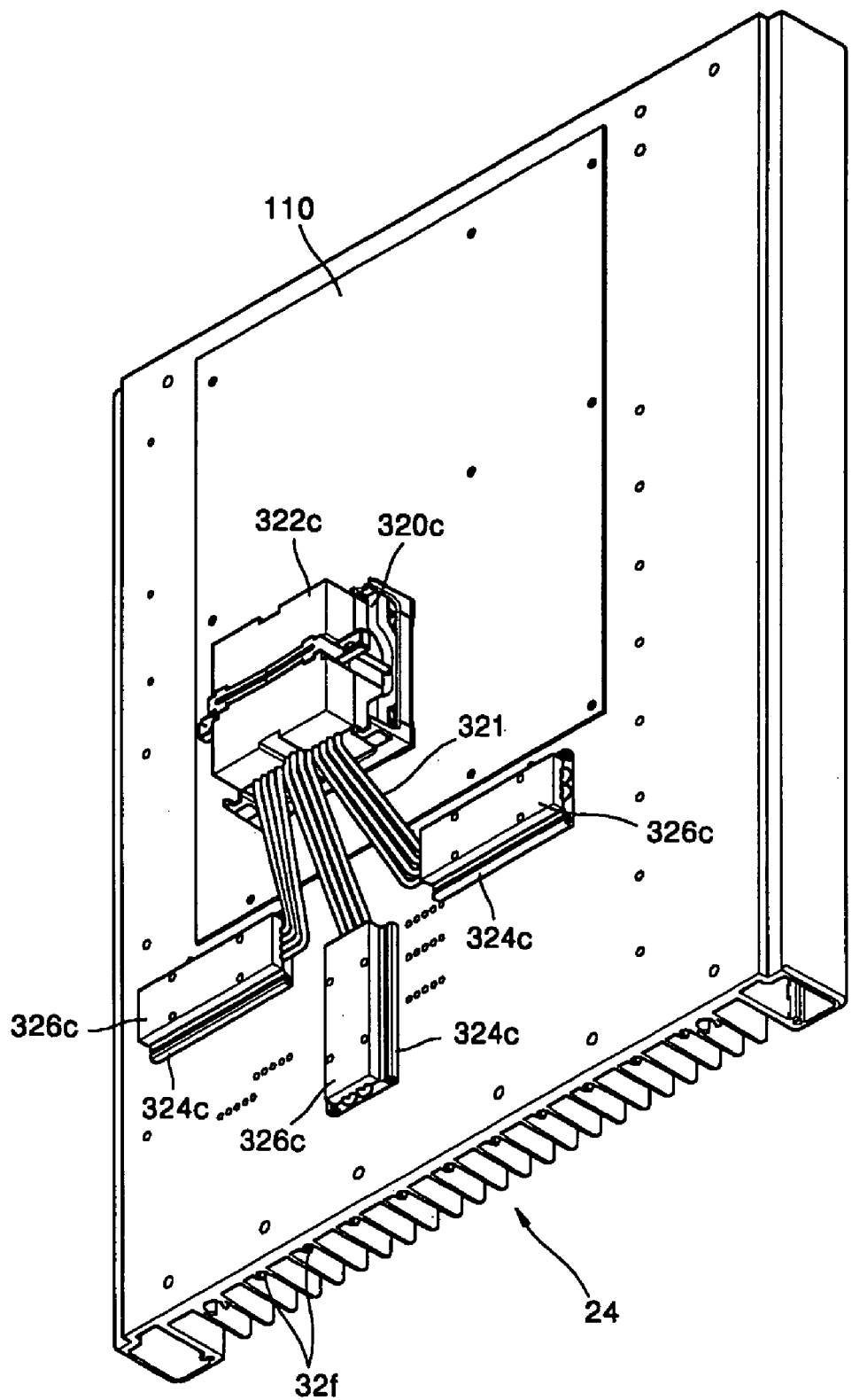
FIGS. 5B and 5C illustrate modified examples of the heat conduction unit shown in FIG. 5A.
Figure 5C:
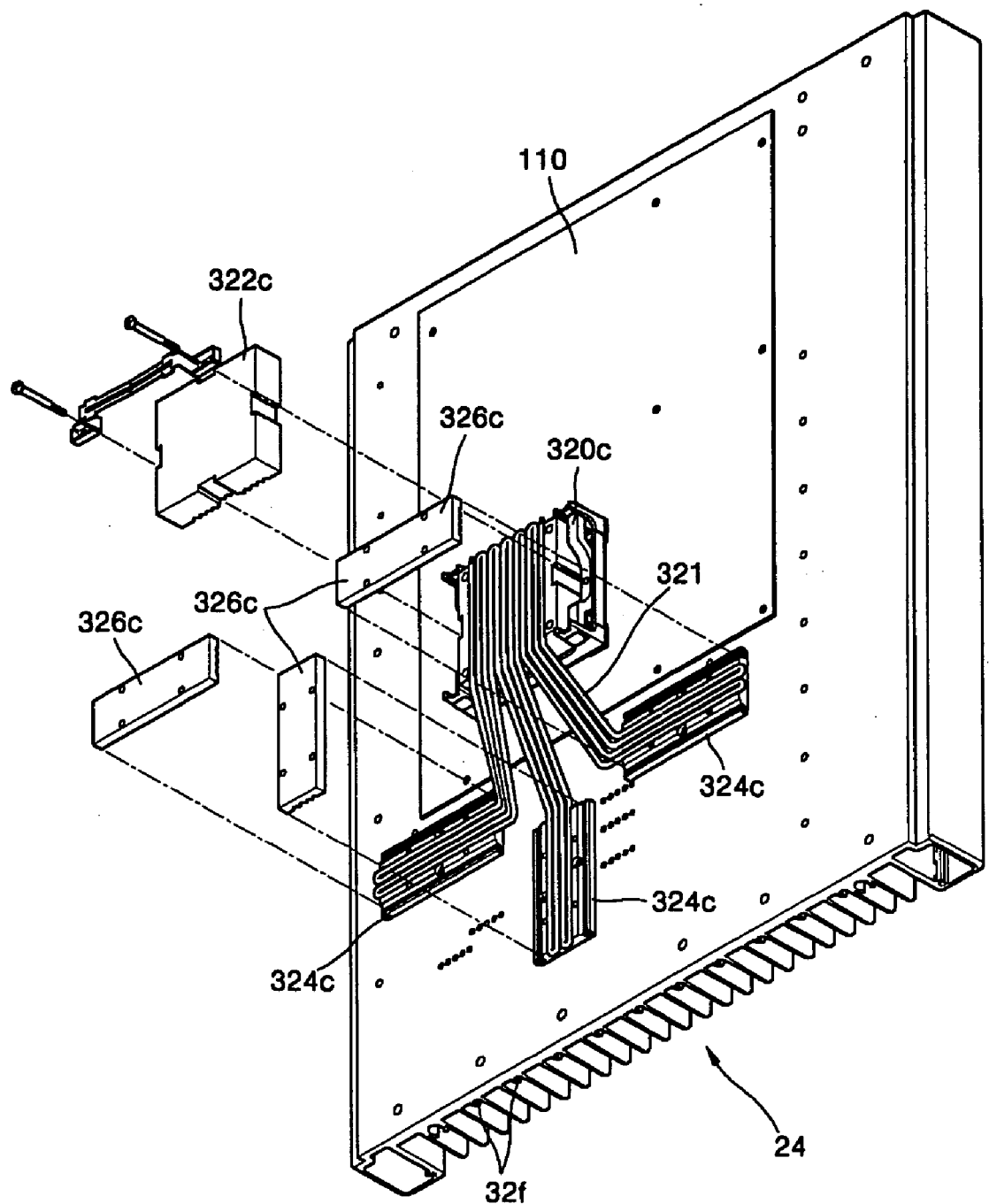

A modified structure of the heat conduction unit shown in FIG. 5A is illustrated in FIGS. 5B and 5C. FIG. 5B is a perspective view of an assembled heat conduction unit, and FIG. 5C is an exploded perspective view of FIG. 5B.

The heat conduction unit having the structure shown in FIGS. 5A and 5B is suitable when the CPU 120 is mounted in a lower portion of a main board 110. Unlike the structure of FIG. 5A, where the heat pipes 32c are installed such that the ends contacting a higher temperature area are lower than or level with the other ends contacting a lower temperature area, a heat pipe 321, called a serpentine micro-heat pipe having no positional limitation, is used. As shown in FIG. 5C, the heat pipe 321 is a single long pipeline bent in a serpentine pattern. The micro-heat pipe 321 conducts heat from a higher temperature area to a lower temperature area regardless of its position.

In other words, according to the present invention, the portions of the heat pipes 321 that contact the first heat conducting block, which is comprised of the first and second members 320c and 322c, absorbs the heat generated by the CPU 120. The portions of the heat pipes 321 that contact the three second heat conducting blocks, each of which is comprised of the first and second members 324c and 426c, transmit the heat to the right plate 24. The heat transferred to the right plate 24 is dissipated into air through the entire body of the right plate 24. Due to the heat pipes 32f on the right plate 24, the heat can be rapidly transmitted to the entire body of the right plate 24.

The detailed structure of the micro heat pipe 321 absorbing or transmitting heat is well known in the art and is not a main feature of the invention, and thus a detailed description thereof will be omitted.

Figure 6:
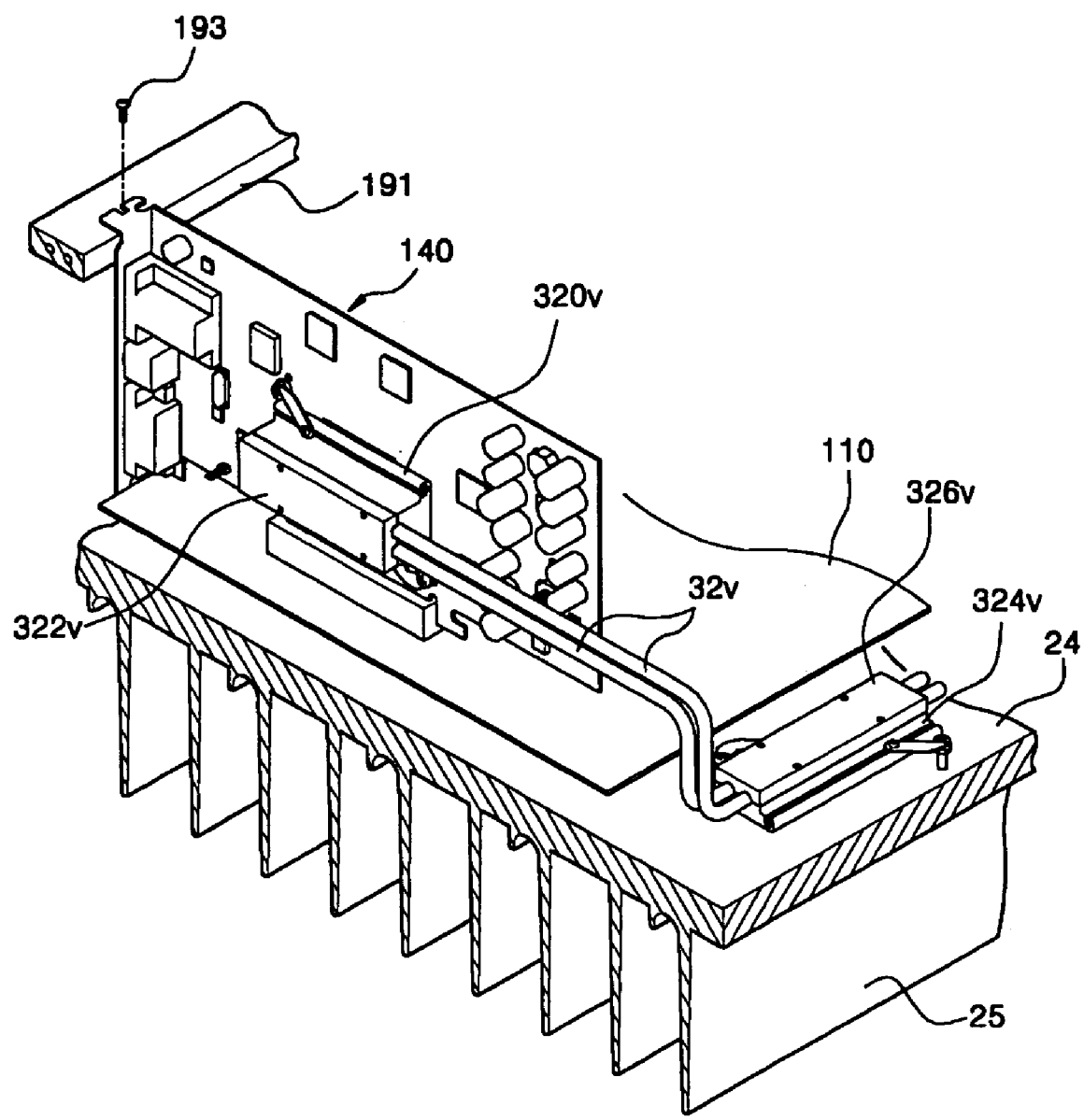
FIG. 6 shows a heat conduction unit for a graphics card in FIG. 2.

FIG. 6 is a view from the bottom of the graphics card 140 illustrated in FIG. 2. Referring to FIG. 6, the graphics card 140, which is another heat generating component, is mounted in a lower portion of the main board 110 separated from the right plate 24. One edge of the graphics card 140 is fixed to a support guide 191 by a screw 193. Both ends of the support guide 191 are respectively fixed to the upper plate 26 and the lower plate 27 by screws. A heat conduction unit is mounted to transfer heat generated when the graphics card 140 operates to the right plate 24.

The heat conduction unit for the graphics card 140 includes a pair of heat pipes 32v. An end of each of the heat pipes 32v is thermally connected to a heat generating component of the graphics card 140 via a first heat conducting block, and the other end is thermally connected to the internal surface of the right plate 24 via a second heat conducting block. The first and second heat conducting blocks are made of a material having a great thermal conductivity, for example, aluminum or copper. The first heat conducting block is comprised of a first member 320v and a second member 322v, and the second heat conducting block is comprised of a first member 324v and a second member 326v.

The structures and functions of the first and second members 320v and 322v of the first heat conducting block, the heat pipes 32v, and the first and second members 324v and 326v of the second heat conducting block are substantially the same as the first and second members 320c and 322c of the first heat conducting block, the heat pipes 32c, the first and second members 324c and 326c of the second heat conducting member, which are described above in connection with the heat conduction unit for the CPU 120. Thus, descriptions thereon will not be provided here.

Figure 7:
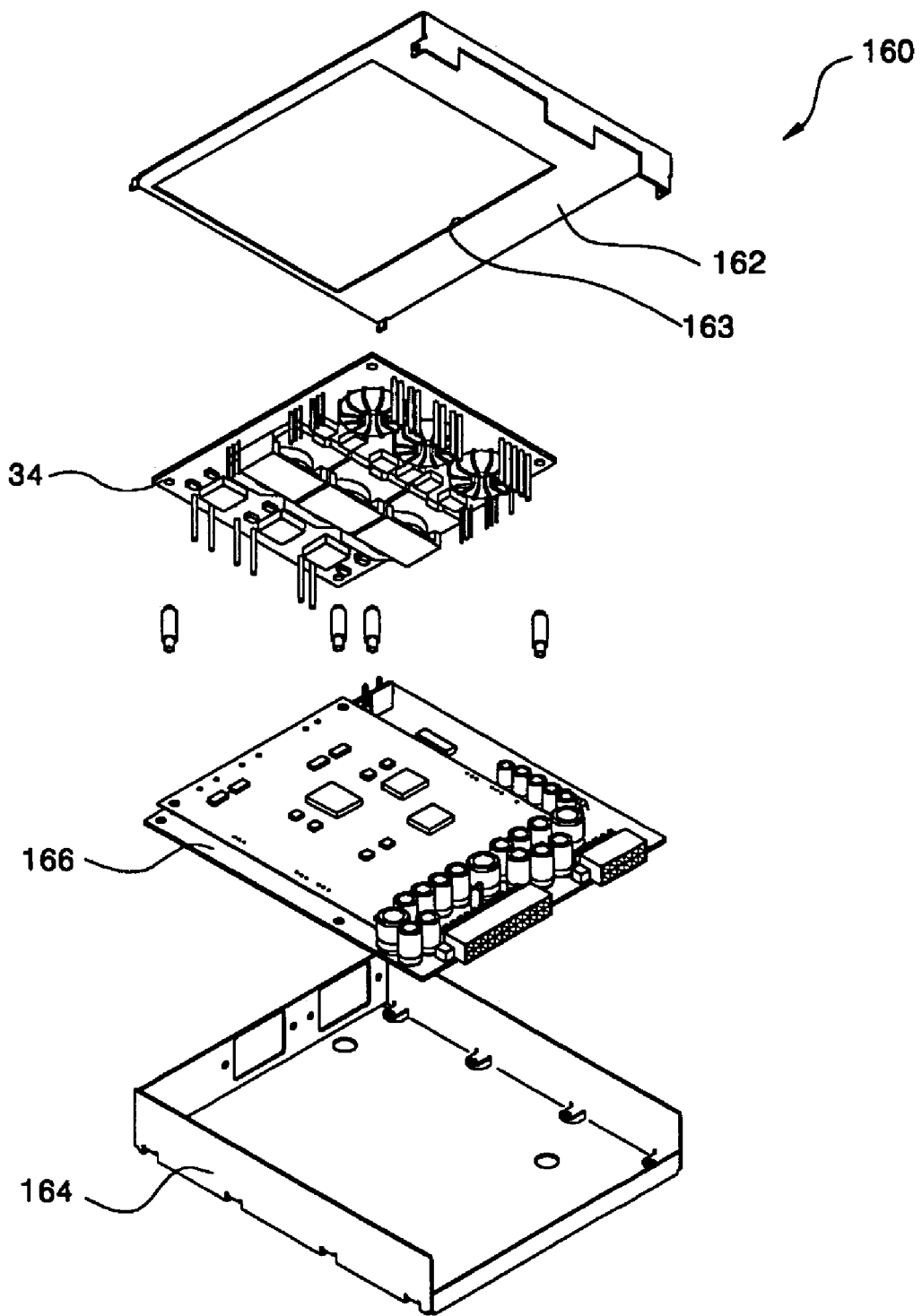
FIG. 7 is an exploded perspective view of a power supply in FIG. 2.

FIG. 7 is an exploded perspective view of the power supply 160, which is one of the heat generating components illustrated in FIG. 2. The power supply 160 includes a heat conducting member 34, which transfers heat generated by the power supply to a plate of the case. A plurality of electric components are installed in the power supply 160. Some of the electric components that generate a larger amount of heat, such as a power transistor, a transformer, or coils, are thermally connected to the heat conducting member 34. A surface portion of the heat conducting member 34 contacts the internal surface of the plate. Accordingly, when the power supply 160 is operated, heat is generated by the electric components and transferred to the heat conducting member 34, which is thermally connected thereto, and then to the plate that contacts the heat conducting member 34.

In an embodiment according to the present invention, the heat conducting member 34 is an aluminum circuit board. Referring to FIGS. 2 and 5, a surface 342 of the heat conducting member 34 contacts the internal surface 222 of the left plate 22. Referring to FIG. 7, a power transistor, a transformer, or coils, which generate a larger amount of heat when operated, are mounted on the heat conducting member 34. The power supply 160 includes a lower case 162 having an opening 163 exposing the aluminum circuit board 34 fixed thereto, a printed circuit board 166 on which non-heat generating components are mounted, and an upper case 164.

The aluminum circuit board 34 acts as a heat conduction unit that conducts heat generated by the power supply 160 to the left plate 22. In other words, to externally dissipate the heat generated by the heat generating components of the power supply 160 via the heat dissipating fins 23 of the left plate 22, the heat generating components of the power supply 160 are mounted on the aluminum circuit board 34 having a great thermal conductivity, and the aluminum circuit board 34 is installed such that the surface 342 opposite to the heat generating components contacts the internal surface 222 of the left plate 22.

Although the heat conducting member 34 is described as being the aluminum circuit board in the embodiment, the material and structure of the heat conducting member 34 are not limited thereto. For example, the heat conducting member 34 may be implemented as a common printed circuit board. In this case, a separate heat conducting member is installed to directly or indirectly thermally contact higher temperature electric components mounted on the common printed circuit board, and the heat conducting member is brought to thermally contact a surface of the plate. The heat conducting member may be made of a material having a heat conductivity that is similar to or greater than aluminum.

According to an embodiment of the present invention, the computer 1 includes guide rails 40 and guide member 42 used to fix some of the parts 10 to the case.

Figure 8A:
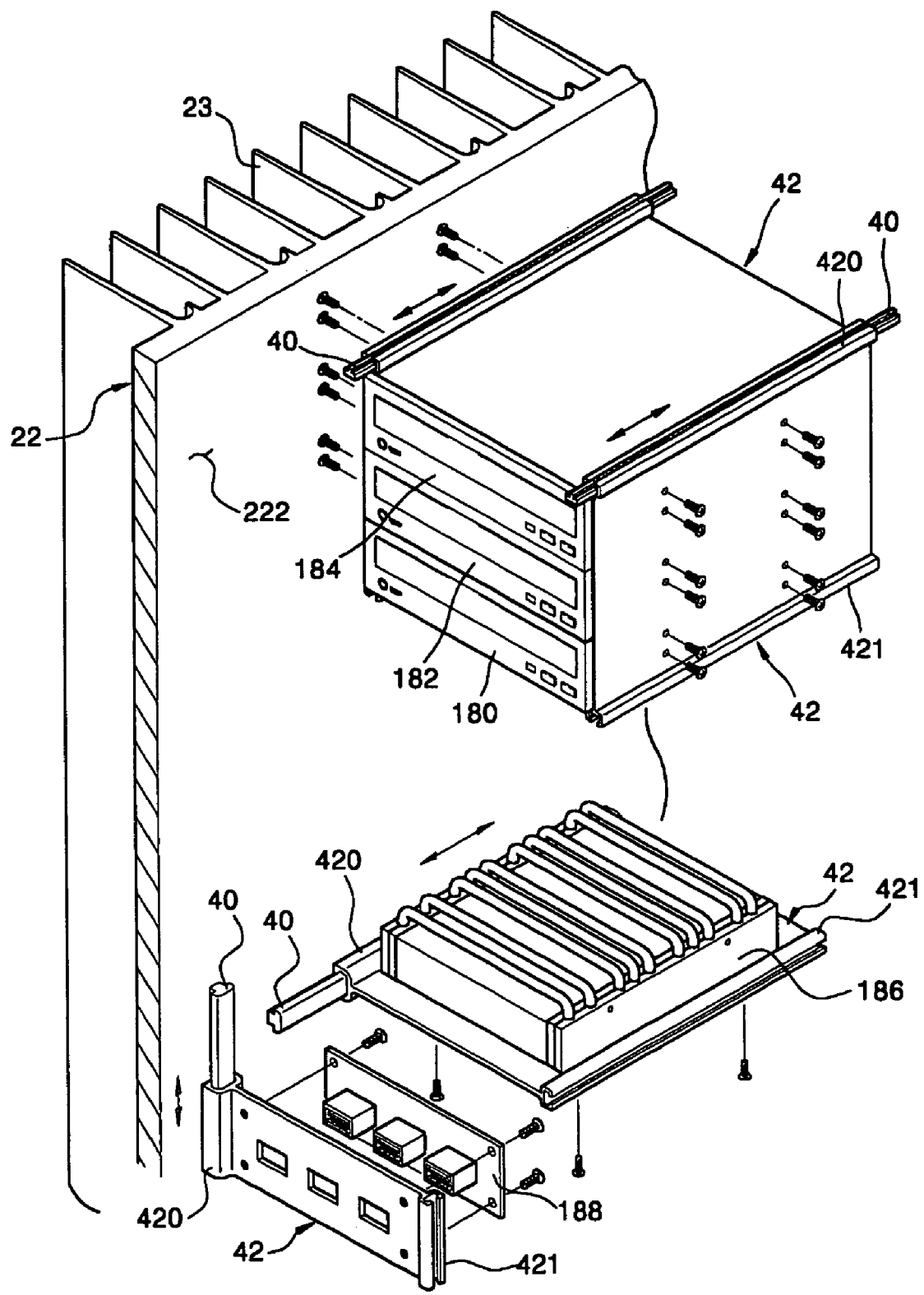
FIGS. 8A, 8B, and 8C are views illustrating guide rails and guide members used to install parts in a computer case.

Referring to FIG. 8A, some of the parts 10, for example, the main board 110 and the power supply 160, are directly fixed using screws to the right plate 24 and the left plate 22, respectively, whereas some other parts, for example, a DVD-ROM drive 180, a CD-RW drive 182, a floppy disk drive 184, a hard disk drive 186, an universal serial bus (USB) port 188, etc. are mounted in the computer case using the guide rails 40 and the guide members 42.

Figure 8B:
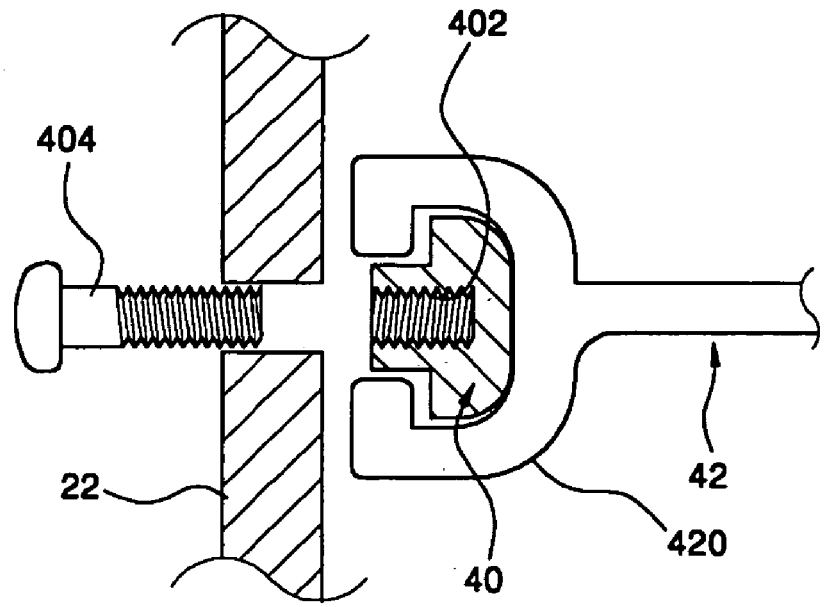
Figure 8C:
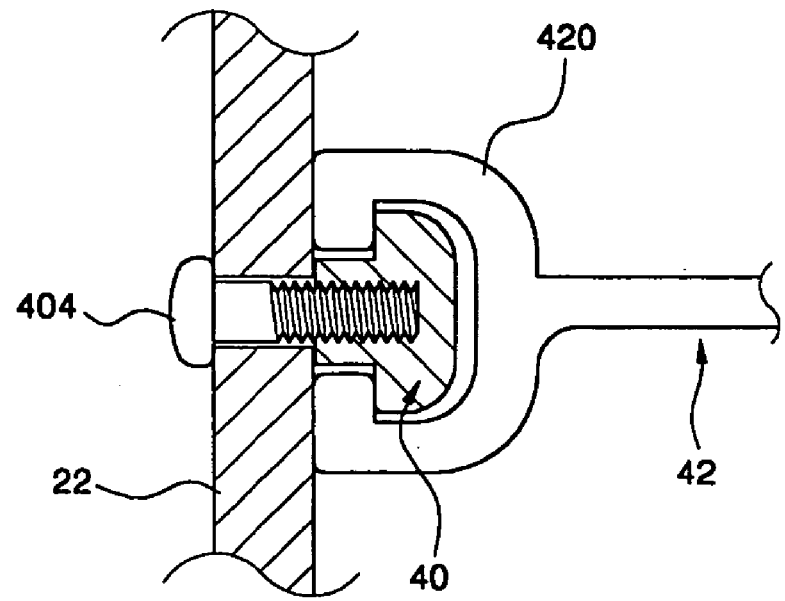

The guide rails 40 are rod members having a cross-section as shown in FIGS. 8B and 8C and have an internally threaded groove 402. One or a pair of guide rails 40, which are parallel to each other, may be used if required. One or a pair of guide rails 40 may be fixed in any position on the internal surface of any plate.

The guide members 42 have two opposite edges 420 and 421 that have a cross-section corresponding to the cross-section of the guide rails 40. The two edges 420 and 421 may have an identical shape if required. A guide rail 40, which may be fixed to any plate, is slidably coupled to one of the edges 420 and 421. The guide members 42 have a flat portion connecting the two opposite edges 420 and 421. Some of the parts 10 are put on the flat portion and are fixed thereto using screws. When a bolt 404 is screwed through the plate into the internally threaded groove 402 of the guide rail 40, as shown in FIGS. 8B and 8C, the position of the guide rail 40 on the internal surface of the plate is fixed, and the position of the guide member 42 to which the guide rail 40 is slidably coupled is fixed.

When a plurality of parts, for example, the DVD-ROM drive 180, the CD-RW drive 182, and the floppy disk drive 184, are mounted as shown in FIG. 8A, the edges 421 of the guide members 42, which are vertically aligned with each other, may be connected by an auxiliary guide member (not shown).

FIG. 9 shows the computer 1 according to the present invention, in which the internal parts 10 of the computer 1 are connected to external peripheral devices 300 by various cables 310. The internal parts 10 of the computer 1 have at least one connection port 50 connected to the external peripheral devices 300, for example, a monitor, a printer, an external memory device, etc. by the various cables 310. The connection ports 50 of the internal parts 10 are located inside the case.

As is apparent from FIGS. 2 and 9, an end of the cables 310 is connected to the connection ports 50 of the internal parts 10, and the other end is connected to the external peripheral devices 300 through the cable apertures 52 in a rear portion of the upper plate 26 or the cable apertures 52 in a front and a rear portion of the lower plate 27. The cables 130 may be more conveniently coupled to the connection ports 50 of the internal parts 10 when the front plate 28 and the left plate 22 of the computer case are opened.

The computer 1 according to the first embodiment of the present invention utilizes the case assembled from aluminum plates that have a great thermal conductivity. In addition, a heat conduction unit for each heat generating component is disposed in the computer case to more effectively transmit heat generated by the heat generating components to the plates. Most of the heat is transmitted to the left plate 22 and the right plate 24 having the heat dissipating fins 23 and 25, so that efficient cooling can be achieved due to the large heat dissipating area.

In other words, according to the present invention, various cooling fans that have been used in conventional computer systems to cool the heat generating components are eliminated. Instead, the computer case made of a material that has a great thermal conductivity and having the heat dissipating fins 23 and 25 on the external sides thereof is utilized. After heat generated in the computer case is transmitted to the heat dissipating fins and formed on the external walls of some of the plates of the case, the heat is cooled by natural convection with external air. Therefore, no noise is generated when cooling the heat generating components, unlike the conventional computer that utilizes a plurality of cooling fans for cooling. In addition, since the temperature of the external air that is utilized for cooling in the present invention is 7–8° C., on average, lower than the temperature of the internal air, the heat generating components can be more efficiently cooled according to the present invention.

In the above embodiment according to the present invention, the heat generated by the CPU 120 and the graphics card 140 is effectively transmitted to the right plate 24 having the heat dissipating fins 25 by means of the heat pipes 32c and 32v having a great thermal conductivity. In addition, a large amount of heat generated by the power supply 160 is effectively transmitted to the left plate 22 that has the heat dissipating fins 23 via the aluminum circuit board 34 on which the heat generating components of the power supply 160 are mounted and which is coupled to contact the internal surface 222 of the left plate 22.

In the computer 1 according to the present invention, the plates, including the left plate 22 and the right plate 24, of the computer case are made of an aluminum plate having a thickness of, for example, about 5–7 mm, which is large enough for rigidity, so that the guide rails 40 and the guide member 42 can be fixed in any positions within the computer case. Therefore, a plurality of parts can be mounted in the computer case with more convenience, and the internal space of the computer case can be more efficiently utilized.

In the computer 1 according to the present invention, the left plate 22 and the front plate 28 of the computer case can be opened and shut, the upper plate 26 and the lower plate 27 have the cable apertures 52, and the connection ports 50 of the parts 10 are located inside the computer case. In addition, there is a little exchange of the external and internal air. Therefore, external dust particles do not enter the computer case, so that the internal parts are protected from contamination by the external air.

In addition, since the plates of the case are formed of aluminum plates having a thickness of 5–7 mm, the connection portions 50 are located inside the case, and the EMI block 54 is located near each of the cable apertures 52, so that electromagnetic waves generated by the electronic parts installed in the case is prevented from exiting the case.

Although the above embodiment of the computer 1 according to the present invention is described with reference to the left, right, upper, lower, front, and rear plates of the computer case that are made of aluminum, it will be appreciated that the material of the computer case is not limited to aluminum and may be any material having a great thermal conductivity, for example, copper.

Although the computer 1 according to the present invention is described in the above embodiment as having the heat dissipating fins 23 and 25 on the left plate 22 and the right plate 24, it will be appreciated that the present invention is not limited to this structure and that the heat dissipating fins 23 and 25 may be formed on alternative plates or may be additionally formed on other plates.

Although in the above embodiment of the computer 1 according to the present invention the heat pipes are positioned such that an end of each of the heat pipes that contacts a higher temperature area is positioned at a level equal to or lower than the other end contacting a lower temperature area, it will be appreciated that the present invention is not limited to this structure and that heat pipes that can be installed in any position regardless of the temperature at the ends of the heat pipes may be used.

Although in the above embodiment of the computer 1 according to the present invention the CPU 120, the graphics card 140, and the power supply 160 are described as exemplary heat generating components, it will be appreciated that the present invention may be applied to other heat generating components, for example, the hard disc driver 186, if required and a heat conduction unit for the hard disc driver 186 that utilizes heat pipes may be installed.

Although in the above embodiment of the computer 1 according to the present invention the CPU 120, the graphics card 140, and the power supply 160 are described as exemplary heat generating components, it will be appreciated that the present invention may be applied to other heat generating components, for example, the hard disc drive 186, if required and a heat conduction unit for the hard disc drive 186 that utilizes heat pipes may be installed.

Although in the above embodiment of the computer 1 according to the present invention the CPU 120 or the graphics card 140 is described as having a heat conduction unit including heat pipes, it will be appreciated that the present invention is not limited to this structure and that a heat conduction unit for the CPU 120 or the graphics card 140 may be arranged to contact the internal surface of a plate of the computer case to transmit heat generated by the CPU 120 or the graphics card 140.

Although the computer 1 according to the present invention is described in the above embodiment as including the heat pipes 32f between the heat dissipating fins 23 and 25 of the left and fight plates 22 and 24, it will be appreciated that the present invention is not limited to this structure and that the heat pipes 32f may be not used if required.

Although in the above embodiment of the computer 1 according to the present invention the guide rails 42 and the guide members 42 are used to install some of the parts in the computer case, it will be appreciated that the present invention is not limited to this structure and that other common methods can be utilized to install parts in the computer case.

Computers 1a, 1b, and 1c according to other embodiments of the present invention are illustrated in FIGS. 10 through 19.

The computers 1a, 1b, and 1c according to the present invention differ from the computer 1 according to the first embodiment described above in that cases are smaller than the case of the computer 1, but are substantially the same as the computer 1 in that heat generated by the heat generating components installed in the case is transmitted to the plates of the case via heat conduction units, not using cooling fans, and externally dissipated.

Regarding the computers 1a, 1b, and 1c, the layouts of the parts installed in the cases are slightly varied from the computer 1 described above. In addition, because the heat dissipating area is reduced due to the smaller left and right plates that have the heat dissipating fins, each of the left and right plates is comprised of a main body portion and a heat dissipating plate portion to increase the heat dissipating area for higher cooling efficiency.

Hereinafter, the computer 1a according to the second embodiment of the present invention will be described in detail. A detailed description of components in the second embodiment included in the first embodiment will be omitted. For parts of the computer 1a that are not described here, the above descriptions of the corresponding parts to those in the computer 1a can be referred to. Elements of the computer 1a that function in the same way as in the computer 1 are denoted by the same reference numerals as used in the first embodiment described above.

Figure 10:
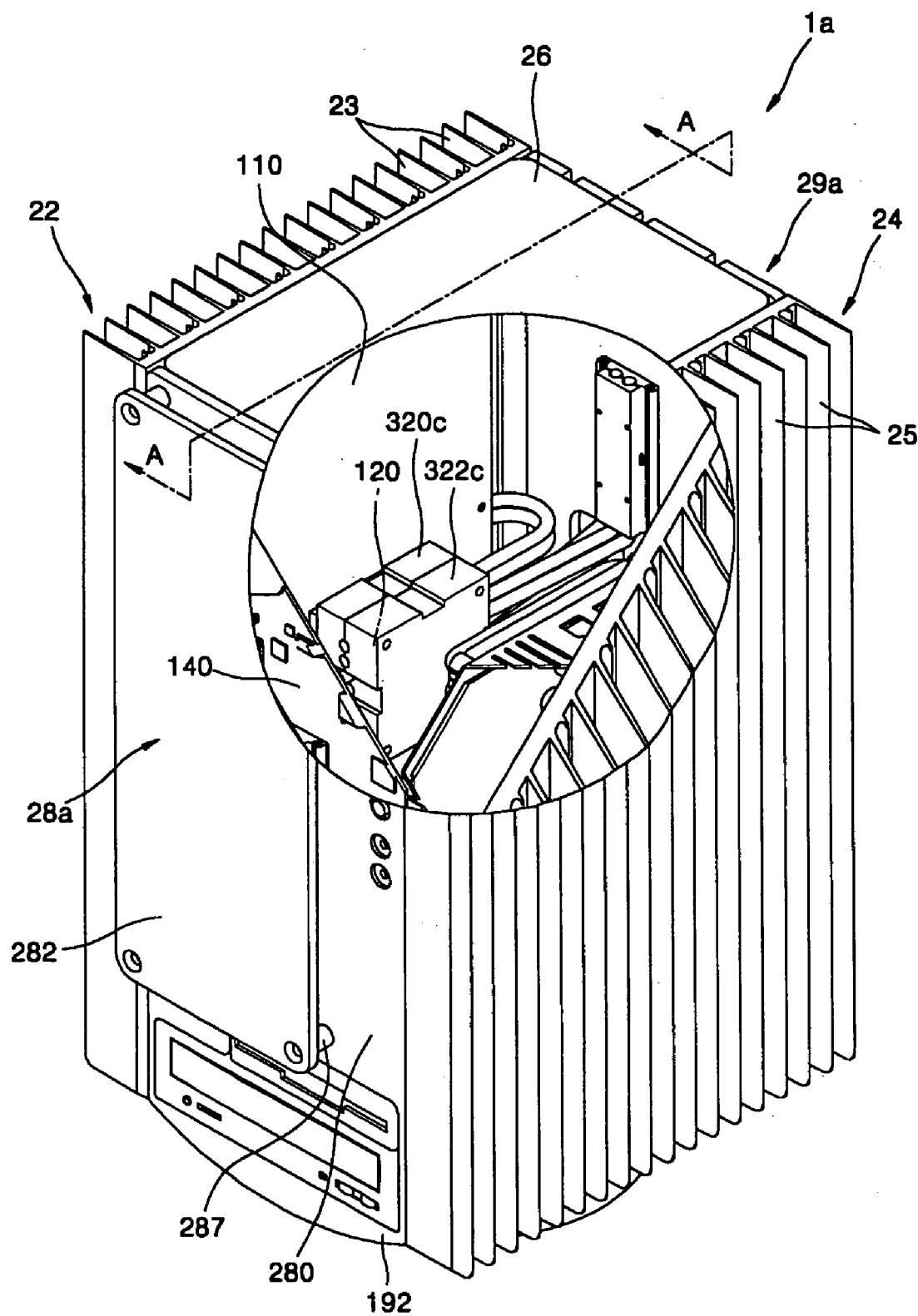
FIG. 10 is a perspective view of a computer according to a second embodiment of the present invention.
Figure 11:
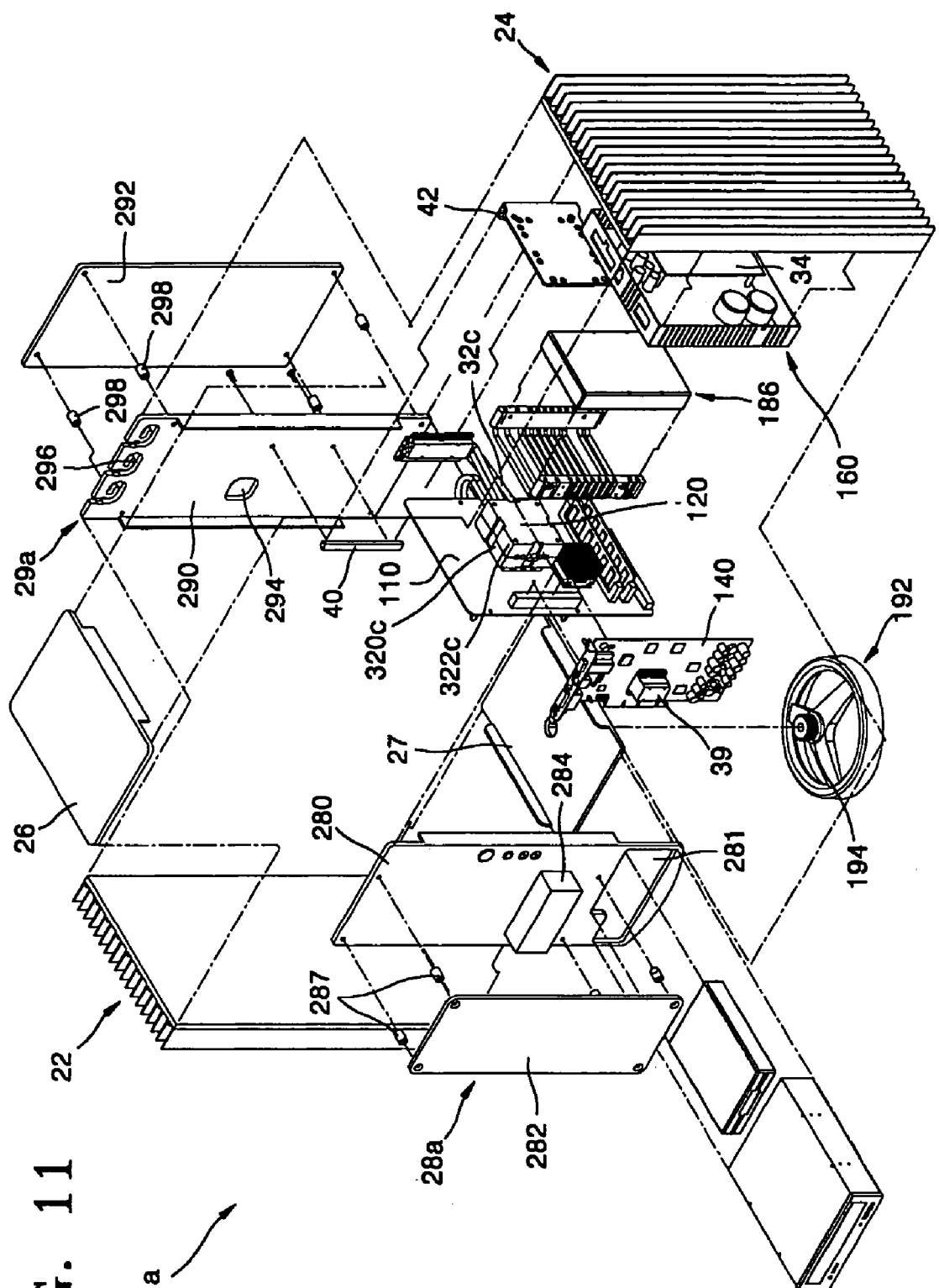
FIG. 11 is an exploded perspective view of the computer of FIG. 10.
Figure 12:
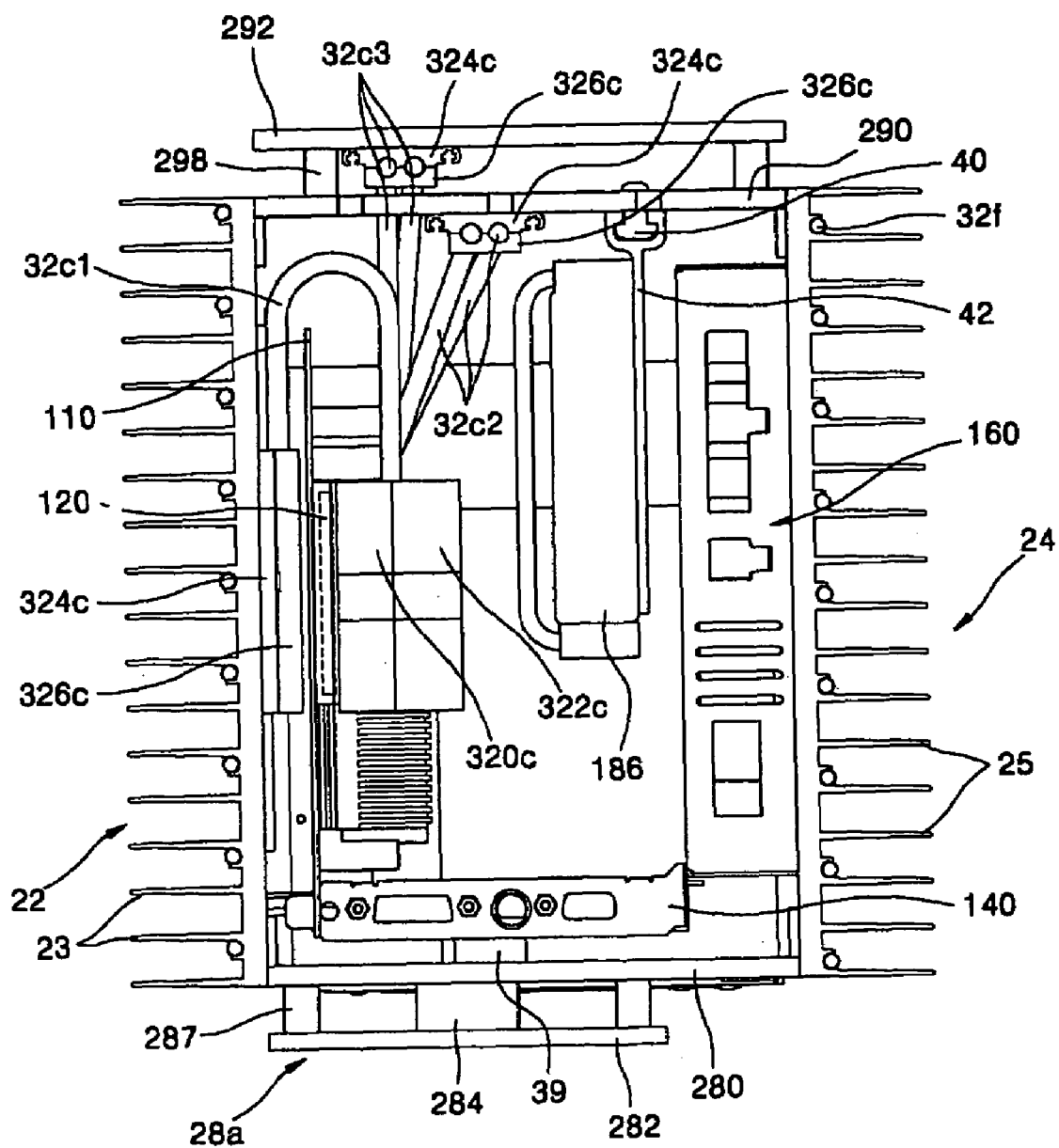
FIG. 12 is a top view of the computer of FIG. 10, in which a top plate of a case is not shown.
Figure 13:
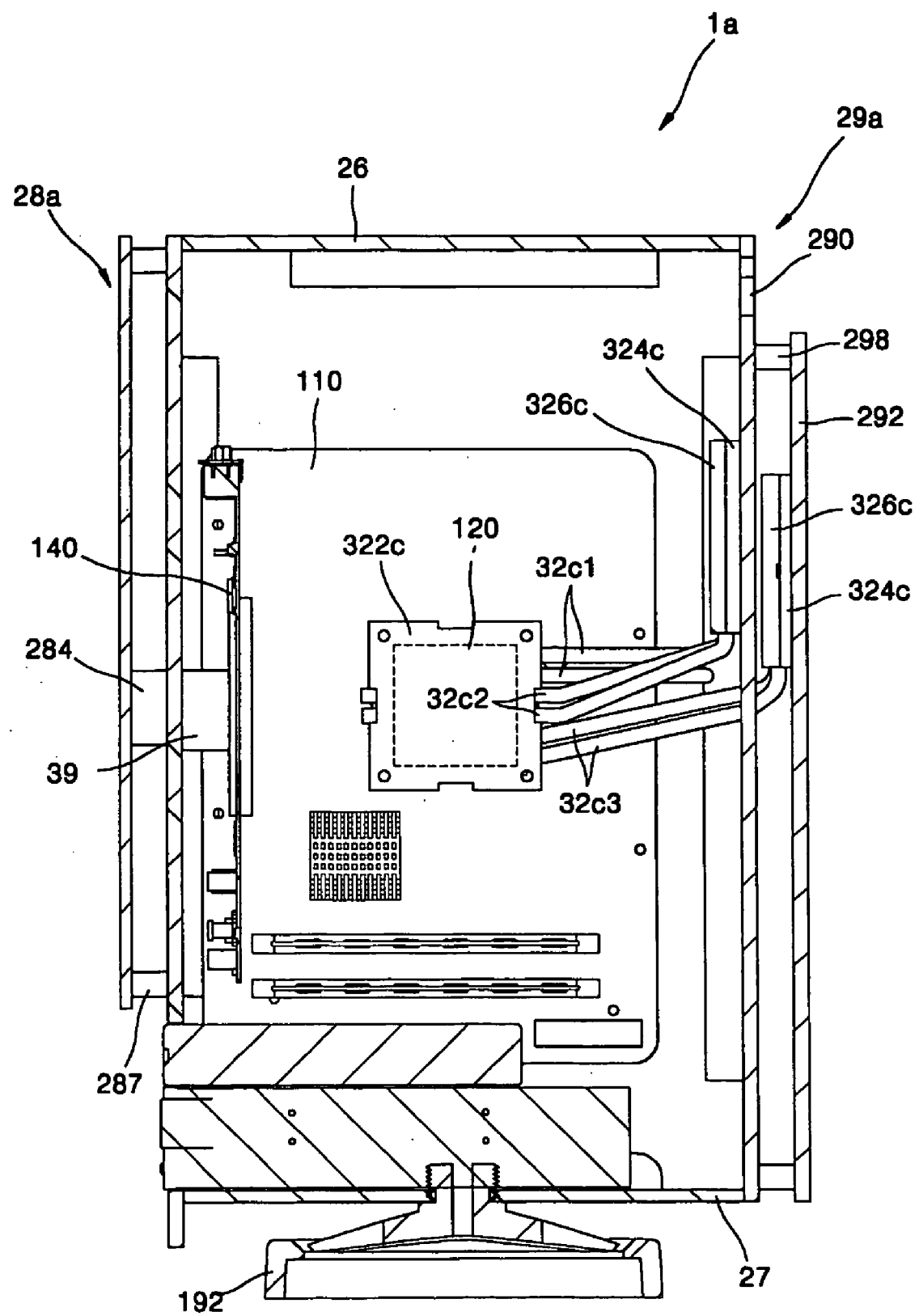
FIG. 13 is a sectional view of the computer taken along line A—A in FIG. 10.

FIG. 10 is a partial cutaway perspective view of the computer 1a according to the second embodiment of the present invention. FIG. 11 is an exploded perspective view of the computer 1a of FIG. 10, FIG. 12 is a top view of the computer 1a of FIG. 10, in which an upper plate is not shown, and FIG. 13 is a sectional view taken along line A—A of FIG. 10.

The computer 1a according to the present invention includes a case accommodating heat generating components. The case is comprised of a plurality of plates, i.e., the left plate 22, the right plate 24, the upper plate 26, the lower plate 27, the front plate 28a, and the rear plate 29a. Examples of heat generating components installed in the case include a CPU 120, a graphics card 140, and a power supply 160. Heat generated by the heat generating components is transmitted to the plates of the case via heat conduction units and externally dissipated.

The left plate 22 and the right plate 24 are similar to those in the first embodiment. In other words, a plurality of vertical heat dissipating fins 23 and 25, which extend outward, are formed on the external surfaced of the left and right plates, and the heat pipes are disposed between the heat dissipating fins 23 and 25. Unlike the first embodiment, the left plate 22 is fixed to other plates using screws, not hinges.

The upper plate 26 and the lower plate 27 of the case are made of aluminum having a great thermal conductivity. Although not illustrated, each of the upper plate 26 and the lower plate 27 may have a plurality of ventilation holes or cable apertures on front and rear edges. A pair of knobs (not shown) may be attached to the upper plate 26.

The front plate 28a includes a main body portion 280 and a heat dissipating plate portion 282, which are made of aluminum having a great thermal conductivity. The main body portion 280 of the front plate 28a has flat surfaces and delimits the internal space of the case. The main body portion 280 is made of a thicker plate than the heat dissipating plate portion 282 for rigidity of the case. An opening 28 into which a CD-Rom, a floppy disc drive, etc., is loaded is formed in a lower portion of the main body portion 280. A plurality of openings into which a USB port, various memory card readers, etc., are fitted are formed in a right edge region of the main body portion 280.

The heat dissipating plate portion 282 of the front plate 28a have flat surfaces and is arranged separated from and parallel to the main body portion 280. The heat dissipating plate portion 282 is separated from the main body portion 280 and fixed in place by a plurality of spacers 287. The spacers 287 may be made of a material having a great thermal conductivity, for example, copper or aluminum. The heat dissipating plate portion 282 may be smaller than the main body portion 280 so as not to interfere with the installation of devices into the openings.

The heat dissipating plate potion 282 is thermally connected to the main body portion 280 by a heat conducting block 284 made of a material having a great thermal conductivity, such as copper or aluminum, to externally dissipate heat transmitted from the main body portion 280. Although not illustrated, the main body portion 280 and the heat dissipating plate portion 282 are thermally connected each other by a heat pipe. Although not illustrated, the main body portion 280 may have an opening through which a heat pipe passes to thermally connect a heat generating component in the case and the heat dissipating plate portion 282.

The rear plate 29a includes a main body portion 290 and a heat dissipating plate portion 292, both of which are made of aluminum having a great thermal conductivity. The main body portion 290 of the rear plate 29a delimits an internal space of the case. The main body portion 290 has an opening 294 in a center area through which a heat pipe 32c described later passes and cable apertures 296 on an upper edge. Although not illustrated, an EMI block may be coupled to each of the cable apertures 296.

The heat dissipating plate portion 292 of the rear plate 29a has flat surfaces and is separated from and parallel to the main body portion 290. The heat dissipating plate portion 290 is separated from the main body portion 290 and fixed in place by spacers 298 as in the front plate 28a described above.

The computer 1a according to the second embodiment of the present invention has a leg member 192 on a bottom of the lower plate 27 of the case, as illustrated in FIG. 11. The leg member 192 spaces a bottom surface of the case from the floor to allow smooth air convection through the space. A rotary member 194 is rotatably coupled to an upper portion of the leg member 192 to allow the case to be freely rotated by a user.

The CPU 120, which is one of the heat generating components, is mounted in an upper portion of the main board 110 that is fixed with a separation gap from the left plate 22. A heat conduction unit is installed to transmit to the plates heat generated when the CPU 120 operates. In this embodiment, heat generated by the CPU 120 is transmitted to the left plate 22 and the main body portion 290 and the heat dissipating plate portion 292 of the rear plate 29a via the heat conduction unit.

The heat conduction unit includes a plurality of heat pipes 32c. In the second embodiment, three pairs of heat pipes 32c are installed. Referring to FIGS. 12 and 13, a pair of heat pipes 32c1 are disposed such that an end of each of the heat pipes 32c1 is thermally connected to the CPU 120 and the other end is thermally connected to the internal surface of the left plate 22 having the heat dissipating fins 23 on the external surface. Another pair of heat pipes 32c2 are installed such that an end of each of the heat pipes 32c2 is thermally connected to the CPU 120 and the other end is thermally to an internal surface of the main body portion 290 of the rear plate 29a. Another pair of heat pipes 32c3 are installed such that an end of each of the heat pipes 32c3 is thermally connected to the CPU 120 and the other end is thermally connected to an internal surface of the heat dissipating plate portion 292.

In other words, one end of each of the heat pipes 32c1, 32c2, and 32c3 is thermal connected to the CPU 120 via one first heat conducting block. The other ends of the pair of heat pipes 32c1 are connected to the internal surface of the left plate 22 via only one second heat conducting block. The other ends of the pair of heat pipes 32c2 are connected to the internal surface of the main body portion 290 of the rear plate 29a through another second heat conducting block. The other ends of the pair of heat pipes 32c3 are thermally connected to the internal surface of the heat conducting plate portion 292 of the rear plate 29a.

The first heat conducting block is comprised of a first member 320c and a second member 322c, and each of the three second heat conducting blocks is comprised of a first member 324c and a second member 326c. The structures and functions of the first and second heat conducting blocks are the same as described in the first embodiment, except that one pair of heat pipes 32c1 is bent in U-shape, and another pair of heat pipes 32c3 pass through the opening 294 of the main body portion 290 of the rear plate 29a and are thermally connected to the heat dissipating plate portion 292.

The graphics card 140, which is another heat generating component, is mounted on the main board 110 separated from the left plate 22. A heat conduction unit is mounted to transfer to the front plate 28a heat generated when the graphics card 140 operates.

The heat conduction unit for the graphics card 140 includes a heat conducting block 39. One side of the heat conducting block 39 contacts a surface of a heat generating component on the graphics card 140 and the other side is thermally connected to an internal surface of the front plate 28. The heat conducting block 39 is made of a material having a great thermal conductivity, for example, aluminum, copper, etc., so that heat generated by the heat generating component on the graphics card 140 is transmitted to the main body portion 280 of the front plate 28a via the heat conducting block 39. A portion of the transmitted heat is dissipated into air fro the main body portion 280, and the remaining portion of the heat is transferred to the heat dissipating plate portion 282 via another heat conducting block 284 disposed between the main body portion 280 and the heat dissipating plate portion 282 and then dissipated into air.

The power supply 160 among the heat generating components includes an aluminum circuit board 34. A surface of the aluminum circuit board 34 contacts the internal surface of the right plate 24. The aluminum circuit board 34 is the same as described in the first embodiment, and detailed descriptions thereof will not be repeated here.

The computer 1a according to the second embodiment of the present invention includes guide rails 40 and guide member 42 used to fix the positions of some of the parts, for example, a hard disc drive 186, in the case.

Although in the second embodiment the computer 1a is described as having the front plate 28a and the rear plate 29a, each of which is comprised of a main body portion and a heat dissipating plate portion, which have flat surfaces, the present invention is not limited to this structure. For example, a plurality of heat dissipating fins may be formed on an external surface of each of the main body portions or an internal or external surface of each of the heat dissipating plate portions if required.

A computer 1b according to a third embodiment of the present invention is illustrated in FIGS. 14 through 17.

The computer 1b according to the third embodiment of the present invention differs from the computer 1a according to the second embodiment of the present invention in that each of a left plate 22b and a right plate 24b is comprised of a main body portion and a heat dissipating plate portion and has a different heat conduction structure via which heat is transmitted from a heat generating component thereto.

Hereinafter, the computer 1b according to the third embodiment of the present invention will be described in detail. A detailed description of components in the third embodiment included in the second embodiment will be omitted. For parts of the computer 1b that are not described here, the above descriptions of the corresponding parts to those in the computer 1b can be referred to. Elements of the computer 1b that function in the same way as in the computer 1a are denoted by the same reference numerals as used in the second embodiment described above.

Figure 14:
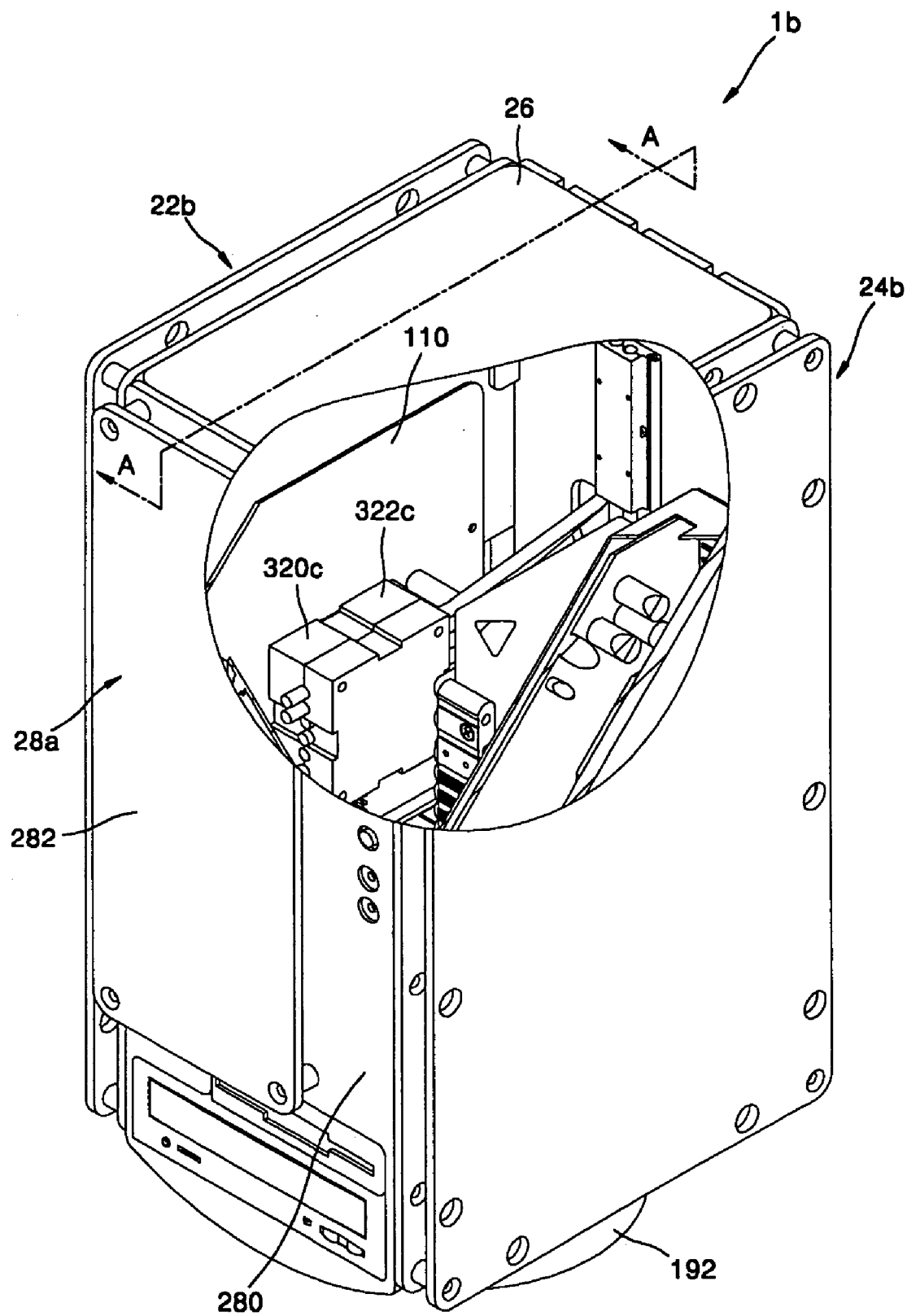
FIG. 14 is a perspective view of a computer according to a third embodiment of the present invention.
Figure 15:
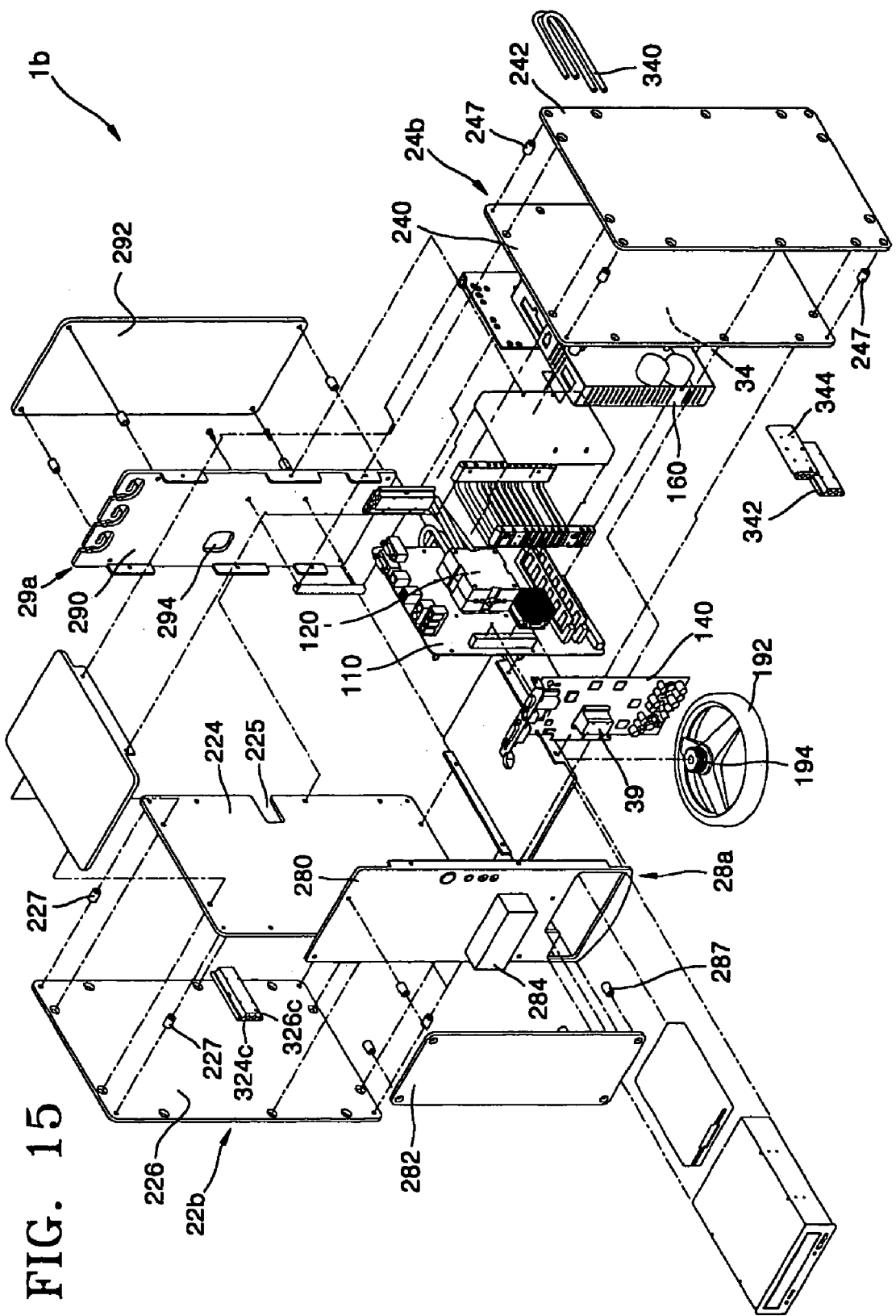
FIG. 15 is an exploded perspective view of the computer of FIG. 14.
Figure 16:
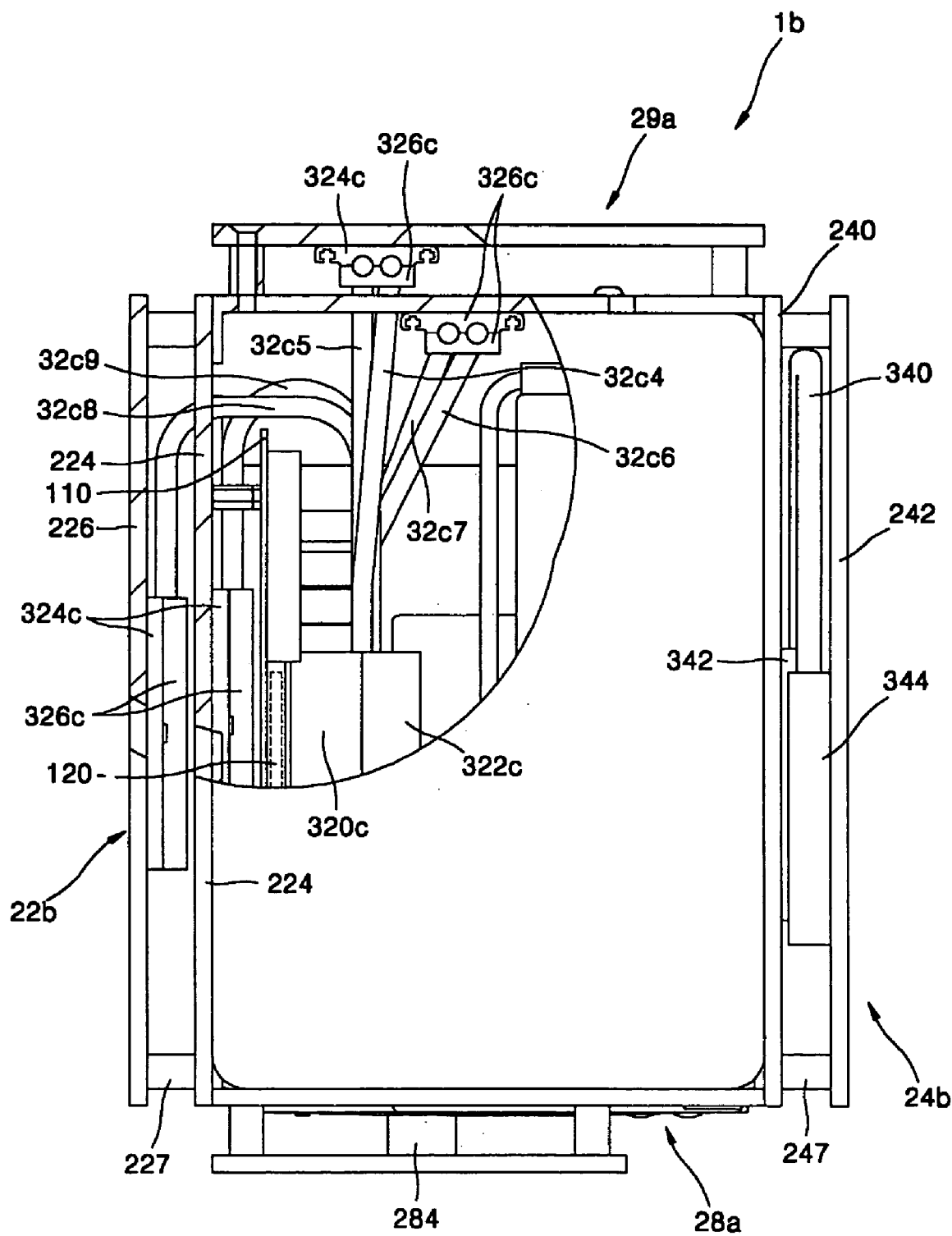
FIG. 16 is a top view of the computer of FIG. 14, in which a top plate of a case is partially not shown.
Figure 17:
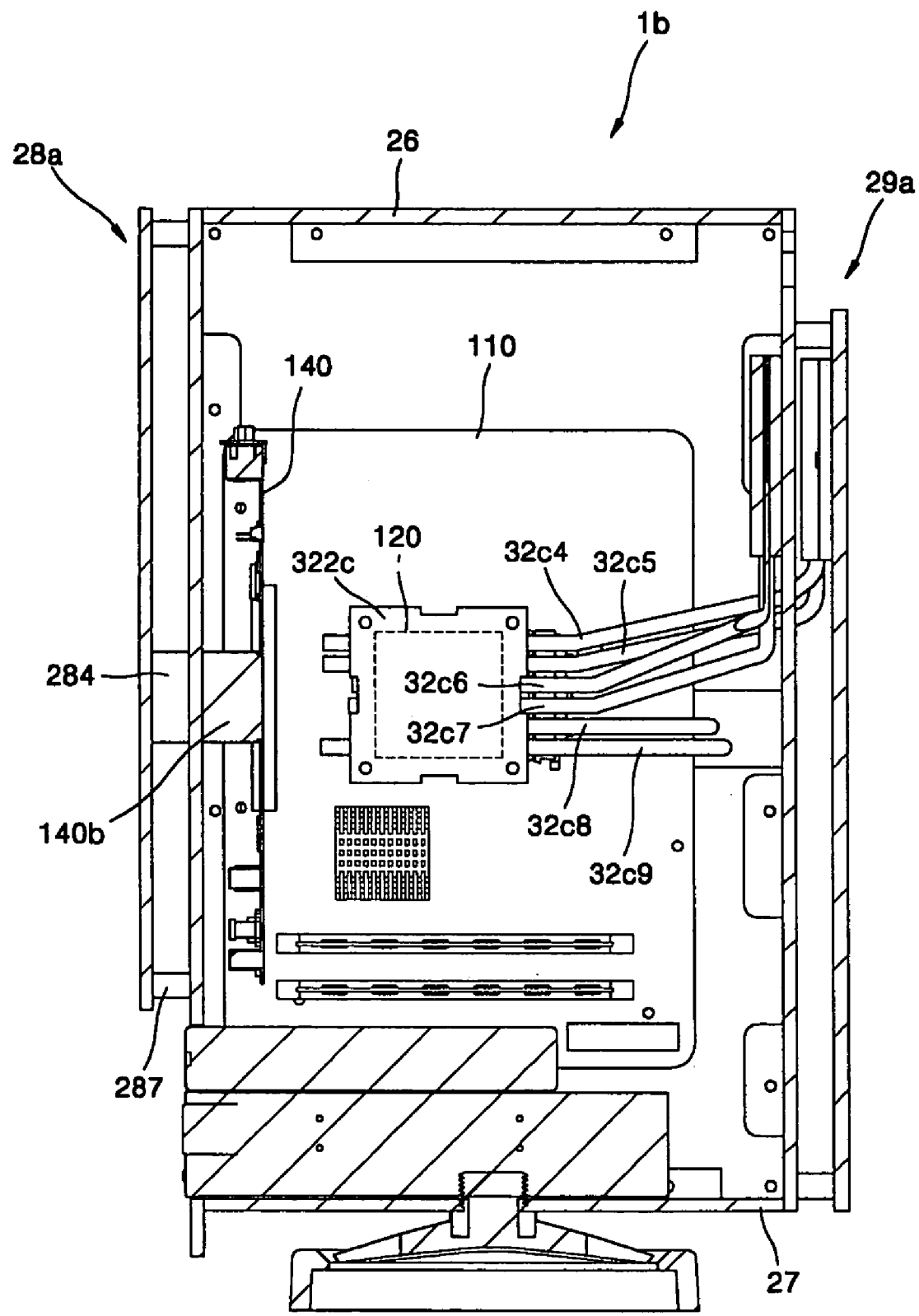
FIG. 17 is a sectional view of the computer taken along line A—A in FIG. 14.

FIG. 14 is a partial cutaway perspective view of the computer 1b according to the third embodiment of the present invention. FIG. 15 is an exploded perspective view of the computer 1b of FIG. 14, FIG. 16 is a top view of the computer 1b of FIG. 14, in which an upper plate is not shown, and FIG. 17 is a sectional view taken along line A—A of FIG. 10.

The computer 1b according to the present invention includes a case accommodating heat generating components. The case is comprised of a plurality of plates, i.e., the left plate 22b, the right plate 24b, the upper plate 26, the lower plate 27, the front plate 28a, and the rear plate 29a. Examples of heat generating components installed in the case include a CPU 120, a graphics card 140, and a power supply 160. Heat generated by the heat generating components is transmitted to the plates of the case via heat conduction units and externally dissipated.

The left plate 22b includes a main body portion 224 and a heat dissipating portion 226, which are made of aluminum having a great thermal conductivity. The main body portion 224 has flat surfaces. The main body portion 224 delimits an internal space of the case together with the other plates and is made of a thicker plate than the heat dissipating plate portion 226 for rigidity of the case. The main body portion 224 has a groove 225 that receives a heat pipe of a heat conduction unit described later.

The heat dissipating plate portion 226 has flat surfaces and is separated from and parallel to the main body portion 224. The heat dissipating plate portion 226 is separated from the main body portion 244 and fixed in place by a plurality of spacers 227. The spacers 227 may be made of a material having a great thermal conductivity, for example, copper or aluminum.

The right plate 24b includes a main body portion 240 and a heat dissipating plate portion 242. The heat dissipating plate portion 242 is adjacent to an outer surface of the main body portion 240 and is separated therefrom by spacers 247. The right plate 24b is similar to the left plate 22b described above, and thus a detailed description thereof will not be provided here. Unlike the left plate 22b having the groove 225, the right plate 24b has no groove.

The front plate 28a and the rear plate 29a are the same as described in the second embodiment. The computer 1b according to the present invention has the leg member 192 as in the second embodiment.

The CPU 120, which is one of the heat generating components, is mounted in an upper portion of the main board 110 that is fixed with a separation gap from the left plate 22b. A heat conduction unit is installed to transmit to the plates heat generated when the CPU 120 operates. In this embodiment, heat generated by the CPU 120 is transmitted to the main body portion 224 and the heat dissipating plate potion 226 of the left plate 22b and the main body portion 290 and the heat dissipating plate portion 292 of the rear plate 29a via heat conduction units.

The heat conduction unit of the computer 1b according to the third embodiment is similar to the heat conduction unit of the computer 1a according to the second embodiment, except that the heat generated by the CPU 120 is transferred to the main body portion 224 and the heat dissipating plate 226 of the left plate 22b via heat pipes.

In particular, referring to FIG. 17, six heat pipes 32c are used. An end of each of the heat pipes 32c is thermally connected to the CPU 120 via a heat conducting block comprised of first and second members 320c and 322c. The other end of each of the upper two heat pipes 32c4 and 32c5 passes through the opening 294 of the main body portion 290 of the rear plate 29a and is connected to the heat dissipating plate portion 292. The other end of each of the heat pipes 32c6 and 32c7 is connected to the main body portion 290 of the rear plate 29a. The other end of the heat pipe 32c8 passes through the groove 225 of the main body portion 224 of the left plate 22b and is connected to the heat dissipating plate portion 226. The other end of the heat pipe 32c9 is connected to the main body portion 224 of the left plate 22b. The other end of each of the heat pipes 32c is thermally connected to the corresponding portion via a heat conducting block comprised of first and second members 324c and 326c.

As in the second embodiment, the graphics card 140, which is another heat generating component, is mounted on the main board 110, and a heat conduction unit is mounted to transfer to the front plate 28a heat generated when the graphics card 140 operates. The structure of the heat conduction unit is the same as in the second embodiment.

The power supply 160 among the heat generating components includes an aluminum circuit board 34 as a heat conduction unit. A surface of the aluminum circuit board 34 contacts the internal surface of the main body portion 240 of the right plate 24b.

The heat dissipating plate portion 242 of the right plate 24b is thermally connected to the main body portion 240 via a heat pipe 340. As illustrated in FIG. 15, the heat pipe 340 has a U-shape, and an end of the heat pipe 340 is thermally connected to the main body portion 240 and fixed in place via a heat conducting block 342 contacting an external surface of the main body portion 240. The other end of the heat pipe 340 is thermally connected to the heat dissipating plate portion 242 and fixed in place via a heat conducting block 344 contacting an internal surface of the heat conducting block 344. The heat pipe 340 is positioned such that the end connected to the main body portion 240 is lower than the other end connected to the heat dissipating plate portion 242.

As described above, the heat generated by the power supply 160 is transferred to the main body portion 240 of the right plate 24b via the aluminum circuit board 34. A portion of the transmitted heat is dissipated into air by natural convection, and the remaining portion of the heat is transferred to the heat dissipating plate portion 242 via the heat pipe 340 and dissipated into air.

Figure 18:
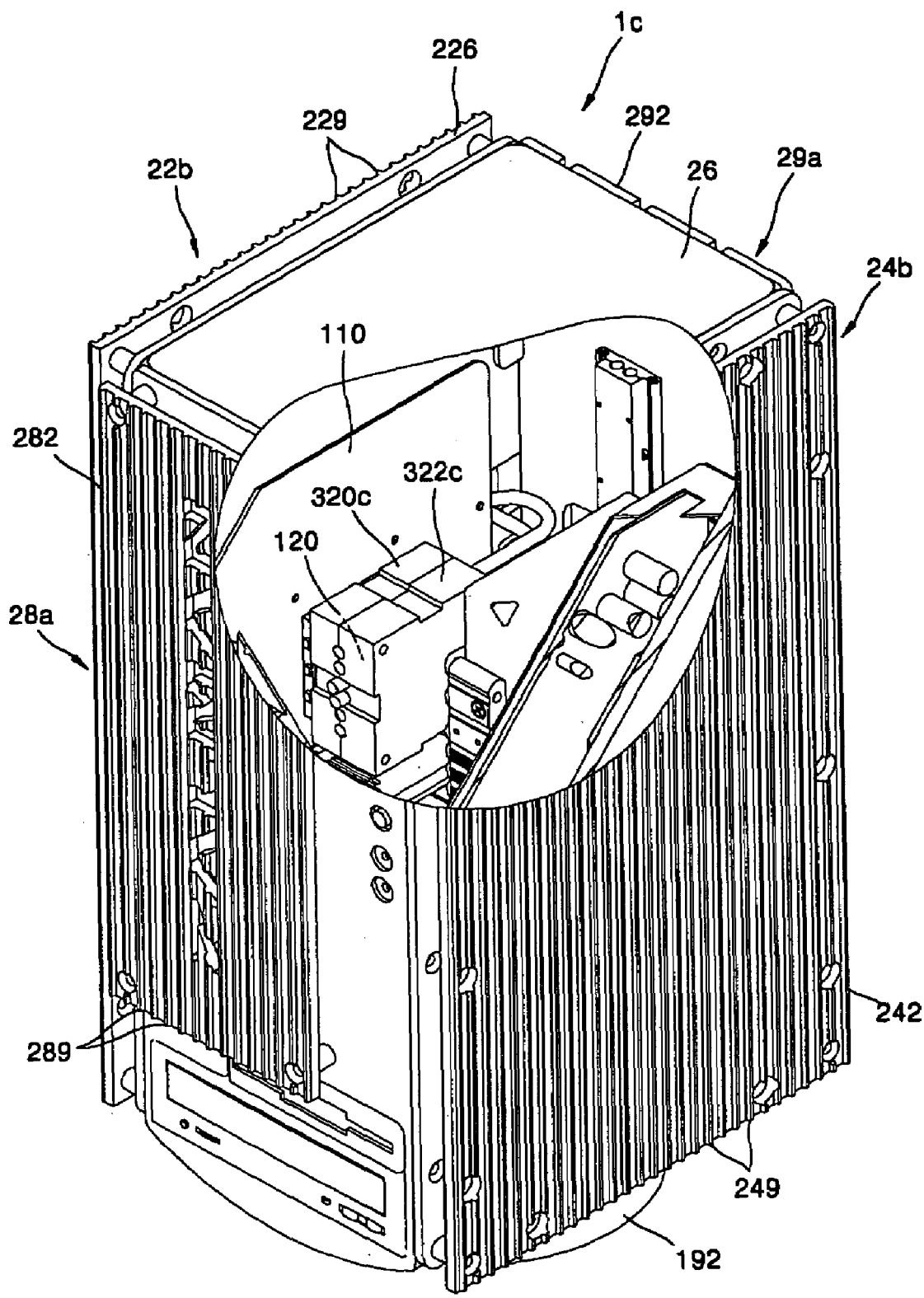
FIG. 18 is a perspective view of a computer according to a fourth embodiment of the present invention.
Figure 19:
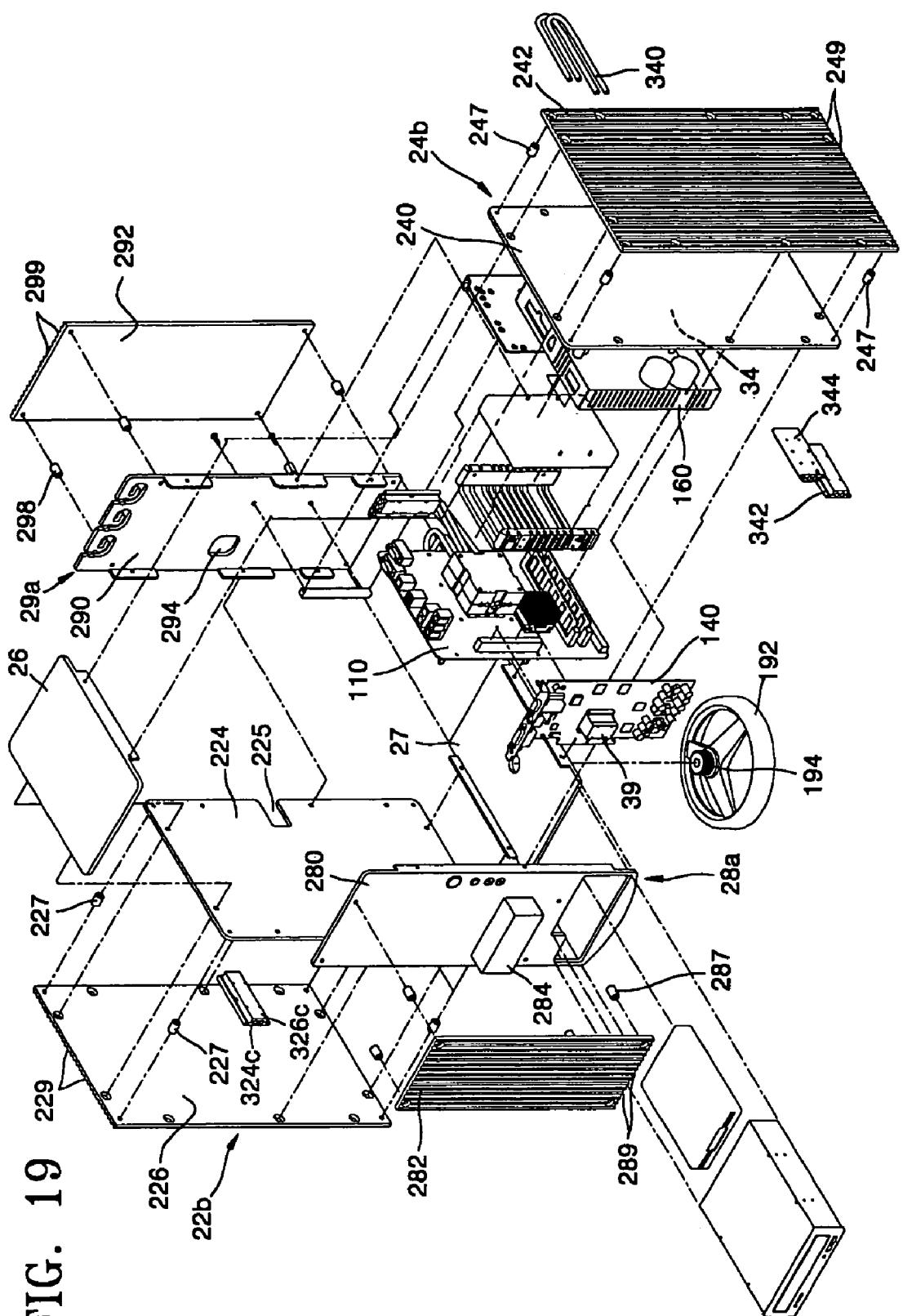
FIG. 19 is an exploded perspective view of the computer of FIG. 18.

A computer 1c according to a fourth embodiment of the present invention is illustrated in FIGS. 18 and 19. FIG. 18 is a partial cutaway perspective view of the computer 1c according to the third embodiment of the present invention. FIG. 15 is an exploded perspective view of the computer 1c of FIG. 18.

The computer 1c according to the present invention differs from the computer 1b according to the third embodiment in that all the heat dissipating plate portions 226, 242, 282, and 292 of the respective left, right, front, and rear plates 22b, 24b, 28a, and 29a have a plurality of heat dissipating fins 229, 249, 289, and 299 on external surfaces. The heat dissipating fins 229, 249, 289, and 299 have a smaller length (length of the protruded fins) than the heat dissipating fins 23 and 24 in the first embodiment.

The computer 1c has an increased heat dissipating area because the plurality of vertical heat dissipating fins 229, 249, 289, and 299 are formed over the external surfaces of the heat dissipating plate portions 226, 242, 282, and 292, so that a larger amount of heat can be rapidly dissipated into air from the computer 1c than the computer 1b according to the third embodiment, which has no heat dissipating fin on the heat dissipating plate portions. Considering that a higher performance computer produces a larger amount of heat, the cooling structure of the computer 1c according to the fourth embodiment of the present invention is suitable when a larger amount of heat is generated. Although not illustrated, heat dissipating fins may be formed on the internal surfaces as well as the external surfaces of the heat dissipating plate portions 226, 242, 282, and 292 to further increase the heat dissipating area for higher cooling efficiency.

The computer 1c according to the present invention is the same as the computer 1b according to the third embodiment described above, except for the structure of the heat dissipating plate portions 226, 242, 282, and 292. Thus, detailed descriptions of the computer 1c will not be provided here.

Figure 20:
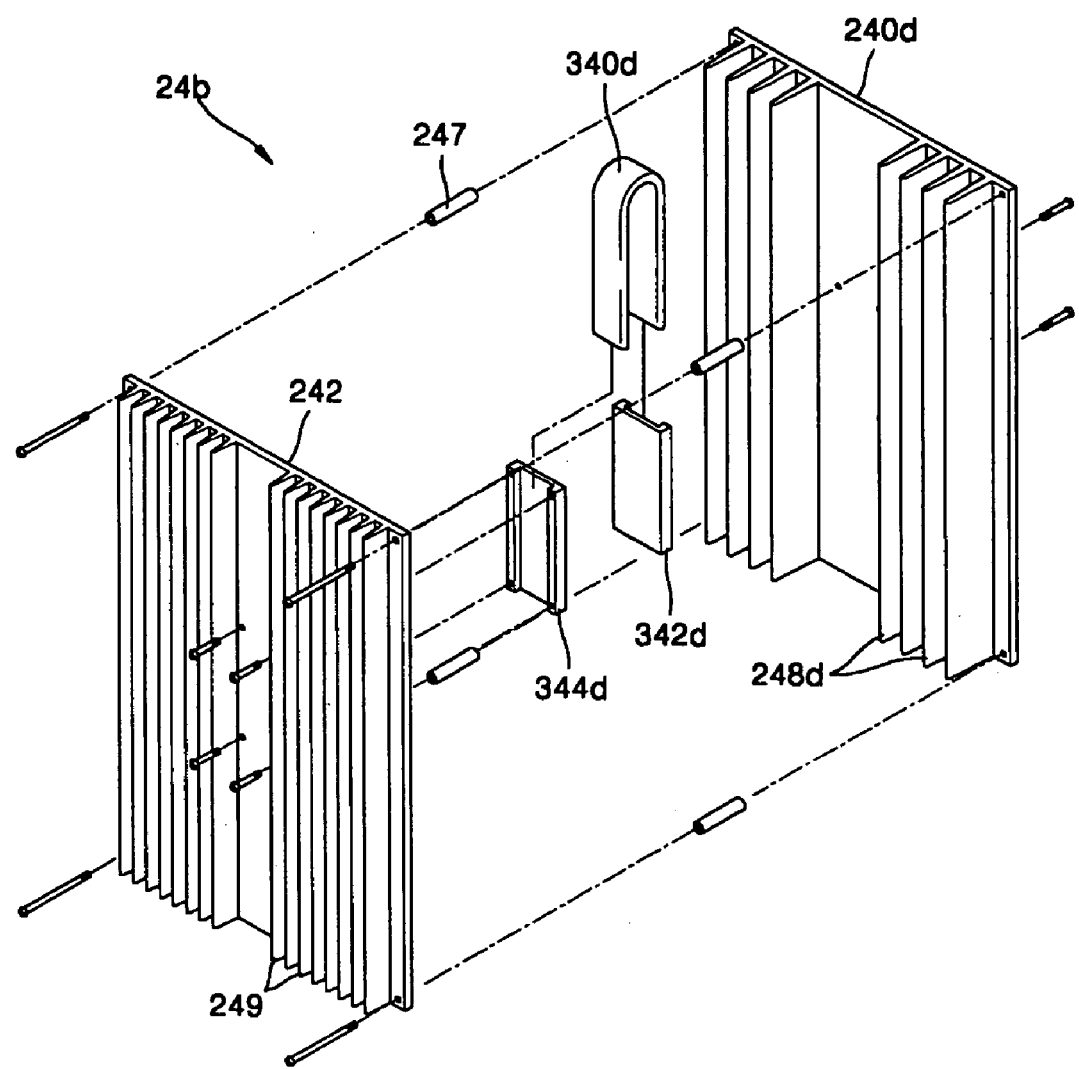
FIG. 20 is an exploded perspective of a modified part of the computer of FIG. 18.

FIG. 20 illustrates a modified example of the right plate 24b of the computer 1c according to the present invention. The right plate 24b of FIG. 20 further has vertical heat dissipating fins 248d on an external surface of the main body portion 240d. In addition, instead of the heat pipes 340 that have to be in a predetermined position, a heat pipe 340d, called a micro heat pipe or a serpentine micro heat pipe and which may be in arbitrary position, is used. In other words, there is no need to position the ends of the heat pipe 340d at different levels. The heat pipe 340d is coupled to a first heat conducting block 342d and a second heat conducting block 344d and fixed in place between the external surface of the main body portion 240d and an internal surface of the heat dissipating plate portion 242.

As described above, in a computer according to the present invention, heat generated by heat generating components mounted in a computer case is transferred to plates of the computer case and is efficiently cooled by heat exchange with external air not using a noise producing cooling fan.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A computer comprising:
a case formed with a plurality of plates, at least one of the plates including a plurality of heat dissipating fins on an external surface of the plate;
heat generating components received in the case, the heat generating components including a power supply;

at least one heat conduction unit, the at least one heat conduction unit connecting at least one of the heat generating components with at least one of the plates such that heat generated by operation of the heat generating components is transmitted to the at least one of the plates via the at least one heat conduction unit; and the power supply having a heat conducting member, a surface of the heat conducting member contacting to an internal surface of at least one of the plates such that heat generated by operation of the power supply is transmitted to the at least one of the plates through the heat conducting member and externally dissipated from the case.

2. The computer of claim 1, wherein a heat pipe is installed between the heat dissipating fins.

3. The computer of claim 1, wherein the heat generating components include a central processing unit, and the at least one heat conduction unit comprises a heat pipe having an end thermally connected to the central processing unit and the other end thermally connected to the at least one of the plates for transmitting heat there-through.

4. The computer of claim 3, wherein the heat pipe of the at least one conduction unit has a diameter of 8 mm or less.

5. The computer of claim 1, wherein the heat generating components include a graphics card, and the at least one heat conduction unit comprises a heat pipe having an end thermally connected to the graphics card and the other end thermally connected to the at least one of the plates for transmitting heat there-through.

6. The computer of claim 3 or 5, wherein the at least one heat conduction unit each comprises:

a first heat conducting block and a second conducting block connected with the corresponding heat pipe.

7. The computer of claim 1, wherein the heat conducting member is an aluminum circuit board having a surface contacting the internal surface of the at least one of the plates and the other surface for mounting the heat generating electric components.

8. The computer of claim 1, wherein at least one of the plates are hinged to one another such that the plates open or close the case.

9. The computer of claim 1, wherein at least one of the plates comprises an electromagnetic wave interception block preventing electromagnetic waves generated by the parts from exiting the case.

10. The computer of claim 1, wherein at least one of the plates is made of aluminum.

11. The computer of claim 1, wherein at least one of the plates comprises:

a guide rail fixed to an internal surface of the corresponding plate; and a guide member slidably coupled to the guide rail along the length of the guide rail for fixing at least one of the heat generating components.

12. The computer of claim 1, further comprising at least one leg member on a bottom of the case to space the bottom of the case from the floor.

13. A computer comprising:

a case formed with a plurality of plates, at least one of the plates respectively including a main body portion and a heat dissipating plate portion, the main body portion and the heat dissipating plate portion disposed adjacent to each other and connected to each other via a thermal conductive member disposed between each other such that heat in the case is externally dissipated from the main body portion and the heat dissipating portion;

heat generating components received in the case; and at least one heat conduction unit, the at least one heat conduction unit connecting at least one of the heat generating components with at least one of the plates such that heat generated by operation of the heat generating components is transmitted to the at least one of the plates via the at least one heat conduction unit and externally dissipated from the case.

14. The computer of claim 13, wherein the at least one heat conduction unit comprises a heat pipe having an end thermally connected to one of the heat generating components and the other end thermally connected to the heat dissipating plate portion.

15. The computer of claim 13, wherein the thermal conductive member disposed between the heat dissipating plate portion and the main body portion is a heat pipe.

16. The computer of claim 13, wherein the heat dissipating plate portion has a plurality of heat dissipating fins protruding from a surface.

* * * * *